United States Patent
Pehlivanoglu

(10) Patent No.: US 10,615,756 B2
(45) Date of Patent: Apr. 7, 2020

(54) APPARATUS AND METHODS FOR LOW NOISE AMPLIFIERS WITH MID-NODE IMPEDANCE NETWORKS

(71) Applicant: SKYWORKS SOLUTIONS, INC., Woburn, MA (US)

(72) Inventor: Engin Ibrahim Pehlivanoglu, Costa Mesa, CA (US)

(73) Assignee: Skyworks Solutions, Inc., Woburn, MA (US)

( * ) Notice: Subject to any disclaimer, the term of this patent is extended or adjusted under 35 U.S.C. 154(b) by 0 days.

(21) Appl. No.: 16/199,656

(22) Filed: Nov. 26, 2018

(65) Prior Publication Data

US 2019/0097591 A1    Mar. 28, 2019

Related U.S. Application Data

(63) Continuation of application No. 15/669,024, filed on Aug. 4, 2017, now Pat. No. 10,171,045.

(Continued)

(51) Int. Cl.
*H04B 15/00* (2006.01)
*H03F 3/181* (2006.01)

(Continued)

(52) U.S. Cl.
CPC .......... *H03F 3/181* (2013.01); *H03F 1/0266* (2013.01); *H03F 1/0272* (2013.01); *H03F 1/0277* (2013.01); *H03F 1/08* (2013.01); *H03F 1/223* (2013.01); *H03F 1/302* (2013.01); *H03F 1/565* (2013.01); *H03F 3/193* (2013.01);

(Continued)

(58) Field of Classification Search
CPC ...... H03F 3/181; H03F 1/0266; H03F 1/0272; H03F 1/08
See application file for complete search history.

(56) References Cited

U.S. PATENT DOCUMENTS 5,751,183 A    5/1998 Lee
5,963,096 A    10/1999 Hoshino
(Continued)

FOREIGN PATENT DOCUMENTS

WO    WO 2016/133896 A1    8/2016

OTHER PUBLICATIONS

Schmidt et al., "A Universal Dual Band LNA Implementation in SiGe Technology for Wireless Applications" IEEE Journal of Solid-State Circuits, vol. 36, No. 7, Jul. 2001 (5 pages).

*Primary Examiner* — Simon King
(74) *Attorney, Agent, or Firm* — Knobbe, Martens, Olson & Bear, LLP

(57) ABSTRACT

Apparatus and methods for LNAs with mid-node impedance networks are provided herein. In certain configurations, an LNA includes a mid-node impedance circuit including a resistor and a capacitor electrically connected in parallel, a cascode device electrically connected between an output terminal and the mid-node impedance circuit, and a transconductance device electrically connected between the mid-node impedance circuit and ground. The transconductance device amplifies a radio frequency signal received from an input terminal. The LNA further includes a feedback bias circuit electrically connected between the output terminal and the input terminal and operable to control an input bias voltage of the transconductance device.

20 Claims, 22 Drawing Sheets

Related U.S. Application Data

(60) Provisional application No. 62/376,624, filed on Aug. 18, 2016.

(51) Int. Cl.
*H03F 1/08* (2006.01)
*H03F 1/02* (2006.01)
*H03F 1/22* (2006.01)
*H03F 1/30* (2006.01)
*H03F 1/56* (2006.01)
*H03F 3/193* (2006.01)
*H03F 3/24* (2006.01)
*H03F 3/72* (2006.01)

(52) U.S. Cl.
CPC ............... *H03F 3/245* (2013.01); *H03F 3/72* (2013.01); *H03F 1/22* (2013.01); *H03F 2200/129* (2013.01); *H03F 2200/168* (2013.01); *H03F 2200/294* (2013.01); *H03F 2200/387* (2013.01); *H03F 2200/391* (2013.01); *H03F 2200/447* (2013.01); *H03F 2200/451* (2013.01); *H03F 2203/7215* (2013.01); *H03F 2203/7221* (2013.01)

(56) References Cited

U.S. PATENT DOCUMENTS

| | | | |
|---|---|---|---|
| 6,177,837 B1 | 1/2001 | Aoki et al. | |
| 6,292,060 B1 | 9/2001 | Yeo et al. | |
| 6,744,322 B1 | 6/2004 | Ma et al. | |
| 6,888,411 B2 | 5/2005 | Behzad | |
| 6,897,729 B1 | 5/2005 | Jin et al. | |
| 7,135,929 B1 | 11/2006 | Costa et al. | |
| 7,489,201 B2 | 2/2009 | Sarkar et al. | |
| 7,515,000 B1 | 4/2009 | Jin et al. | |
| 7,786,806 B2 | 8/2010 | Duperray | |
| 8,217,723 B2 | 7/2012 | Rajendran et al. | |
| 8,264,281 B1* | 9/2012 | Rajendran | 330/301 |
| 10,171,045 B2 | 1/2019 | Pehlivanoglu | |
| 10,230,332 B2 | 3/2019 | Pehlivanoglu | |
| 2003/0115558 A1* | 6/2003 | Hilton | G06F 17/5063 716/109 |
| 2004/0209591 A1 | 10/2004 | Martin et al. | |
| 2004/0227576 A1 | 11/2004 | Vice | |
| 2006/0079194 A1* | 4/2006 | Tired | H03F 3/191 455/283 |
| 2006/0087376 A1* | 4/2006 | Young | H03F 1/523 330/286 |
| 2008/0180579 A1 | 7/2008 | Maxim | |
| 2009/0085670 A1 | 4/2009 | Jeong et al. | |
| 2011/0025415 A1* | 2/2011 | Mu | H03F 1/56 330/251 |
| 2012/0139636 A1* | 6/2012 | Scott | H03G 3/3042 330/285 |
| 2012/0286874 A1* | 11/2012 | Kim | H03F 1/223 330/291 |
| 2012/0293265 A1* | 11/2012 | Heikkinen | H03F 1/565 330/291 |
| 2013/0057346 A1* | 3/2013 | Riekki | H03F 1/0277 330/254 |
| 2015/0244327 A1 | 8/2015 | Ding et al. | |
| 2015/0295596 A1* | 10/2015 | Wloczysiak | H04B 1/0057 370/297 |
| 2016/0269052 A1 | 9/2016 | Pawliuk et al. | |
| 2017/0264249 A1 | 9/2017 | Scott et al. | |
| 2018/0054166 A1 | 2/2018 | Pehlivanoglu | |
| 2019/0158028 A1 | 5/2019 | Pehlivanoglu | |

* cited by examiner

APPARATUS AND METHODS FOR LOW NOISE AMPLIFIERS WITH MID-NODE IMPEDANCE NETWORKS

CROSS-REFERENCE TO RELATED APPLICATIONS

This application is a continuation of U.S. application Ser. No. 15/669,024, filed Aug. 4, 2017 and titled "APPARATUS AND METHODS FOR LOW NOISE AMPLIFIERS WITH MID-NODE IMPEDANCE NETWORKS," which claims the benefit of priority under 35 U.S.C. § 119(e) of U.S. Provisional Patent Application No. 62/376,624, filed Aug. 18, 2016 and titled "APPARATUS AND METHODS FOR LOW NOISE AMPLIFIERS WITH MID-NODE IMPEDANCE NETWORKS," each of which is herein incorporated by reference in its entirety.

BACKGROUND

Technical Field

Embodiments of the invention relate to electronic systems, and in particular, to radio frequency (RF) electronics.

Description of Related Technology

A low noise amplifier (LNA) can be used to boost the amplitude of a relatively weak radio frequency (RF) signal received via an antenna. Thereafter, the boosted RF signal can be used for a variety of purposes, including, for example, driving a switch, a mixer, and/or a filter in an RF communication system.

Examples of RF communication systems with one or more LNAs include, but are not limited to, mobile phones, tablets, base stations, network access points, customer-premises equipment (CPE), laptops, and wearable electronics.

LNAs can be included in RF communication systems to amplify signals of a wide range of frequencies. For example, an LNA can be used to provide low noise amplification to RF signals in a frequency range of about 30 kHz to 300 GHz, such as in the range of about 450 MHz to about 6 GHz for certain communications standards.

SUMMARY

In certain embodiments, the present disclosure relates to a low noise amplifier. The low noise amplifier includes a cascode device, a transconductance device configured to generate an amplified signal based on amplifying an input signal received at an input node, the transconductance device further configured to provide the amplified signal to an output node via the cascode device, and a mid-node impedance network electrically connected between the transconductance device and the cascode device, the mid-node impedance configured to compensate for a parasitic capacitance of the transconductance device.

In some embodiments, the transconductance device and the cascode device are bipolar transistors.

In various embodiments, the parasitic capacitance corresponds to a base-to-collector capacitance of the transconductance device.

In a number of embodiments, the transconductance device and the cascode device are field-effect transistors.

According to several embodiments, the parasitic capacitance corresponds to a gate-to-drain capacitance of the transconductance device.

In some embodiments, the mid-node impedance network includes a resistor and a capacitor electrically connected in parallel with one another.

In a number of embodiments, the mid-node impedance network further includes an inductor electrically connected in parallel with the resistor and the capacitor.

In accordance with certain embodiments, the mid-node impedance network includes at least one element electrically connected in shunt with respect to a signal path between the transconductance device and the cascode device.

In various embodiments, the low noise amplifier further includes a feedback bias circuit configured to control an input bias voltage of transconductance device based on providing feedback from the output node to the input node.

In some embodiments, the low noise amplifier further includes a bias current source configured to generate a bias current that flows through the cascode device, the mid-node impedance network, and the transconductance device.

In certain embodiments, the present disclosure relates to a radio frequency front-end system. The radio frequency front-end system includes a low noise amplifier and an input switch including a first throw for providing the radio frequency input signal to the low noise amplifier. The low noise amplifier includes a cascode device, a mid-node impedance network, and a transconductance device configured to generate an amplified radio frequency signal based on amplifying an input radio frequency signal received at an input node and to provide the amplified signal to an output node via the cascode device and the mid-node impedance network. The mid-node impedance network is electrically connected between the transconductance device and the cascode device and configured to compensate for a parasitic capacitance of the transconductance device.

In some embodiments, the transconductance device and the cascode device are bipolar transistors.

In various embodiments, the parasitic capacitance corresponds to a base-to-collector capacitance of the transconductance device.

According to several embodiments, the transconductance device and the cascode device are field-effect transistors.

In a number of embodiments, the parasitic capacitance corresponds to a gate-to-drain capacitance of the transconductance device.

In some embodiments, the mid-node impedance network includes a resistor and a capacitor electrically connected in parallel with one another.

In accordance with certain embodiments, the mid-node impedance network further includes an inductor electrically connected in parallel with the resistor and the capacitor.

In various embodiments, the mid-node impedance network includes at least one element electrically connected in shunt with respect to a signal path between the transconductance device and the cascode device.

In a number of embodiments, the low noise amplifier further includes a feedback bias circuit configured to control an input bias voltage of transconductance device based on providing feedback from the output node to the input node.

In several embodiments, the radio frequency front-end system further includes a bias current source configured to generate a bias current that flows through the cascode device, the mid-node impedance network, and the transconductance device.

In some embodiments, the radio frequency front-end system further includes a bypass path, and the input switch further includes a second throw electrically connected to the bypass path.

In several embodiments, the radio frequency front-end system further includes a power amplifier, and the input switch further includes a third throw electrically connected to the power amplifier.

In accordance with a number of embodiments, the low noise amplifier, the bypass path, the multi-throw switch, and the power amplifier are embodied on a single die.

In various embodiments, the radio frequency front-end system further includes an output switch having at least a first throw electrically connected to an output of the LNA.

In several embodiments, the input switch is configured to electrically connect an input of the LNA to an antenna in a first state.

According to a number of embodiments, the radio frequency front-end system further includes the antenna.

In some embodiments, the LNA and the input switch are embodied on a single die.

In various embodiments, the LNA and the input switch are embodied on a module.

In certain embodiments, the present disclosure relates to a wireless communication device. The wireless communication device includes a low noise amplifier including a cascode device, a mid-node impedance network, and a transconductance device configured to generate an amplified radio frequency signal based on amplifying an input radio frequency signal received at an input node and to provide the amplified signal to an output node via the cascode device and the mid-node impedance network. The mid-node impedance network is electrically connected between the transconductance device and the cascode device and configured to compensate for a parasitic capacitance of the transconductance device. The wireless communication device further includes an antenna configured to receive the input radio frequency signal.

In some embodiments, the transconductance device and the cascode device are bipolar transistors.

In various embodiments, the parasitic capacitance corresponds to a base-to-collector capacitance of the transconductance device.

In a number of embodiments, the transconductance device and the cascode device are field-effect transistors.

According to several embodiments, the parasitic capacitance corresponds to a gate-to-drain capacitance of the transconductance device.

In some embodiments, the mid-node impedance network includes a resistor and a capacitor electrically connected in parallel with one another.

In accordance with certain embodiments, the mid-node impedance network further includes an inductor electrically connected in parallel with the resistor and the capacitor.

In various embodiments, the mid-node impedance network includes at least one element electrically connected in shunt with respect to a signal path between the transconductance device and the cascode device.

In some embodiments, the low noise amplifier further includes a feedback bias circuit configured to control an input bias voltage of transconductance device based on providing feedback from the output node to the input node.

In a number of embodiments, the wireless communication device further includes a bias current source configured to generate a bias current that flows through the cascode device, the mid-node impedance network, and the transconductance device.

In certain embodiments, the present disclosure relates to a method of low noise amplification. The method includes receiving an input signal at an input node, generating an amplified signal based on amplifying the input signal using a transconductance device of the low noise amplifier, providing the amplified signal to an output node via a cascode device of the low noise amplifier, and compensating for a parasitic capacitance of the transconductance device using a mid-node impedance network that is electrically connected between the cascode device and the transconductance device.

In some embodiments, the method further includes decoupling a gain and a reflection coefficient of the low noise amplifier using the mid-node impedance network.

In a number of embodiments, the method further includes compensating for the parasitic capacitance of the transconductance device including compensating for a base-to-collector capacitance.

In various embodiments, the method further includes compensating for the parasitic capacitance of the transconductance device including compensating for a gate-to-drain capacitance.

BRIEF DESCRIPTION OF THE DRAWINGS

Embodiments of this disclosure will now be described, by way of non-limiting example, with reference to the accompanying drawings.

DETAILED DESCRIPTION OF CERTAIN EMBODIMENTS

Figure 1:
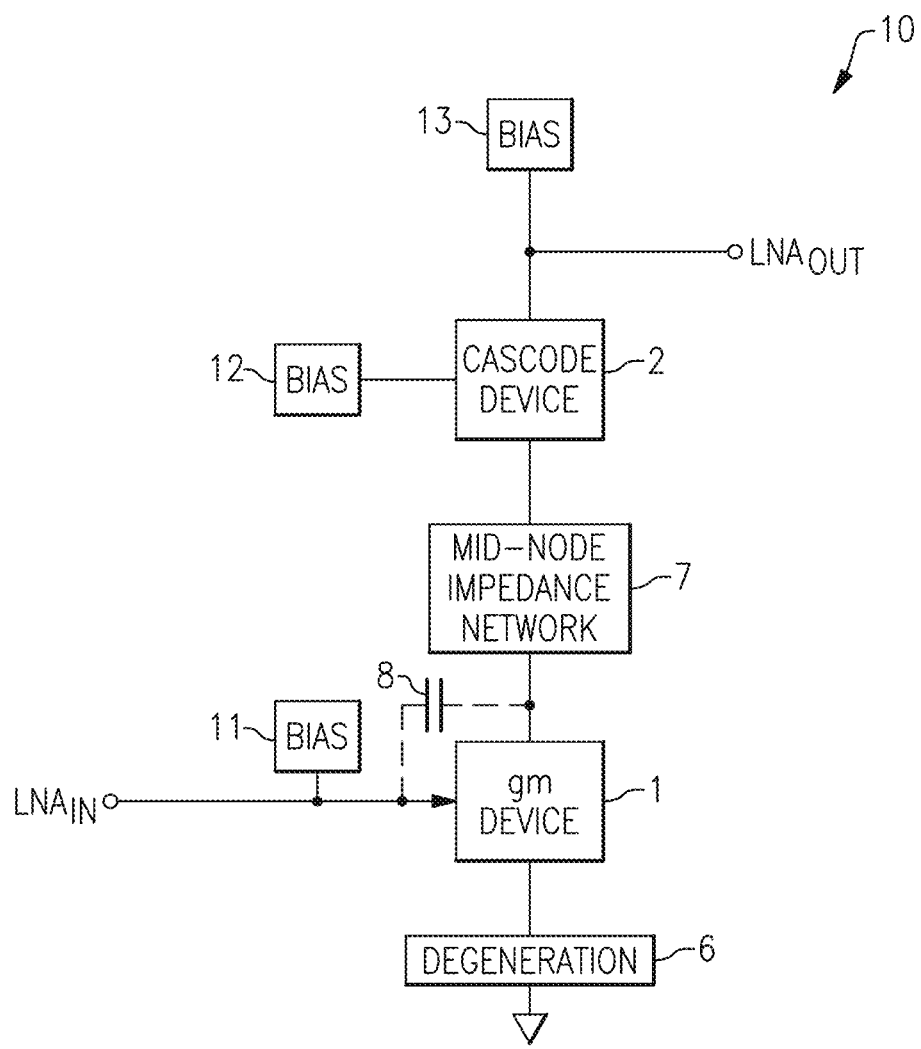
FIG. 1 is a schematic diagram of one embodiment of a low noise amplifier (LNA) with a mid-node impedance network.

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Examples of LNAs with a Mid-Node Impedance Network

Gain is one metric for rating a low noise amplifier (LNA), and can indicate the ability of the LNA to amplify an input signal. Gain is frequency dependent, and can be measured as a ratio of output signal power to input signal power. Reflection coefficient is another metric for rating an LNA, and can indicate how much signal power is absorbed at the input of the LNA relative to how much power is reflected back to the antenna. Reflection coefficient is frequency dependent, and can also be referred to as return loss or S11.

Gain and reflection coefficient can be used to determine whether an LNA is suitable for a particular application. Although excellent gain and reflection coefficient are both desirable, improving gain can come at the cost of degrading reflection coefficient, while improving reflection coefficient can degrade gain. Thus, LNAs can suffer from a trade-off between gain and reflection coefficient.

Apparatus and methods for LNAs with mid-node impedance networks are provided herein. In certain configurations, an LNA includes an input, an output, a transconductance (gm) device, a cascode device, and a mid-node impedance network. The gm device generates an amplified signal by amplifying an input signal received at the input, and provides the amplified signal to the output via the cascode device. The mid-node impedance network is electrically connected between the gm device and the cascode device, and provides compensation for a parasitic capacitance of the gm device, thereby enhancing the LNA's performance.

The mid-node impedance network can provide a variety of benefits, including decoupling or relaxing a design trade-off between reflection coefficient and gain. Thus, the mid-node impedance network provides greater flexibility in achieving S11 and gain/noise figure specifications.

In one example, the parasitic capacitor corresponds to a base-to-collector capacitor or a gate-to-drain capacitor of the gm device. Additionally, the parasitic capacitor leads to a change in input impedance and a corresponding change in small signal performance based on a collector or drain impedance at the gm transistor. The interaction between the gm transistor's parasitic capacitor and the impedance at the gm transistor's collector or drain contributes to a trade-off between reflection coefficient and gain. By including the mid-node impedance network, performance degradation arising from the parasitic capacitor can be reduced or eliminated.

FIG. 1 is a schematic diagram of one embodiment of an LNA 10 with a mid-node impedance network. The LNA 10 includes a gm device 1, a cascode device 2, a degeneration circuit 6, mid-node impedance network 7, an input bias circuit 11, a cascode bias circuit 12, and an output bias circuit 13.

Although FIG. 1 illustrates one embodiment of an LNA with a mid-node impedance network, the teachings herein are applicable to LNAs implemented in a wide variety of ways. Accordingly, other implementations of LNAs are possible, including, but not limited to, LNAs including more or fewer components and/or a different arrangement of components.

The LNA 10 receives an RF input signal at the input $LNA_{IN}$, and provides an amplified RF signal at the output $LNA_{OUT}$. In certain configurations, the amplified RF signal can be provided from the output $LNA_{OUT}$ to a transceiver. For example, the transceiver can include a demodulator that down-shifts the amplified RF signal to baseband or an intermediate frequency for further processing.

In the illustrated embodiment, the gm device 1 amplifies the RF input signal received at the input $LNA_{IN}$, and provides the amplified RF signal to the output $LNA_{OUT}$ via the cascode device 2.

The degeneration circuit 6 can improve input impedance matching, enhance stability, and/or increase the LNA's linearity. In one example, the gm device 1 is implemented using a bipolar transistor, and the degeneration circuit 6 provides emitter degeneration. In another example, the gm device 1 is implemented using a FET, and the degeneration circuit 6 provides source degeneration. In one embodiment, the degeneration circuit 6 includes at least one of an inductor or a resistor.

The input bias circuit 11 provides biasing at the input $LNA_{IN}$, including, for example, biasing of the gm device 1. Additionally, the cascode bias circuit 12 biases the cascode device 2, and the output bias circuit 13 provides biasing at the output $LNA_{OUT}$. The input bias circuit 11, the cascode bias circuit 12, and the output bias circuit 13 can be implemented in a wide variety of ways, and can provide bias voltages and/or bias currents. Although illustrated as separate circuits, in certain implementations, the input bias circuit 11, the cascode bias circuit 12, and/or the output bias circuit 13 can be combined.

As shown in FIG. 1, the gm device 1 includes a parasitic capacitor 8, which can be, for example, a base-to-collector capacitor or a gate-to-drain capacitor. The parasitic capacitor 8 can cause the LNA's input impedance to change based on an impedance present at the collector or drain of the gm device 1. The change in input impedance in turn leads to a change in small signal performance.

The interaction between the gm transistor's parasitic capacitor and the impedance at the gm transistor's collector or drain contributes to a trade-off between reflection coefficient and gain. By including the mid-node impedance network 7, performance degradation arising from the parasitic capacitor 8 can be reduced or eliminated. For example, the mid-node impedance network 7 can provide a mechanism for achieving desired values of S11 and gain/noise figure.

Accordingly, the illustrated LNA 10 includes the mid-node impedance network 7, which decouples a design trade-off between S11 and gain, thereby enhancing flexibility and degree of design freedom.

In certain implementations, the mid-node impedance network 7 includes a parallel combination of a resistor and capacitor. Additionally, the mid-node impedance network 7 is in series with respect to a signal path of the LNA 10. Using a resistor and capacitor can achieve a relatively compact layout, and corresponding low cost. However, other configurations are possible, including, for instance, implementations using inductor(s), and/or a combination of one or more of an inductor, a capacitor, and/or a resistor.

Figure 2A:
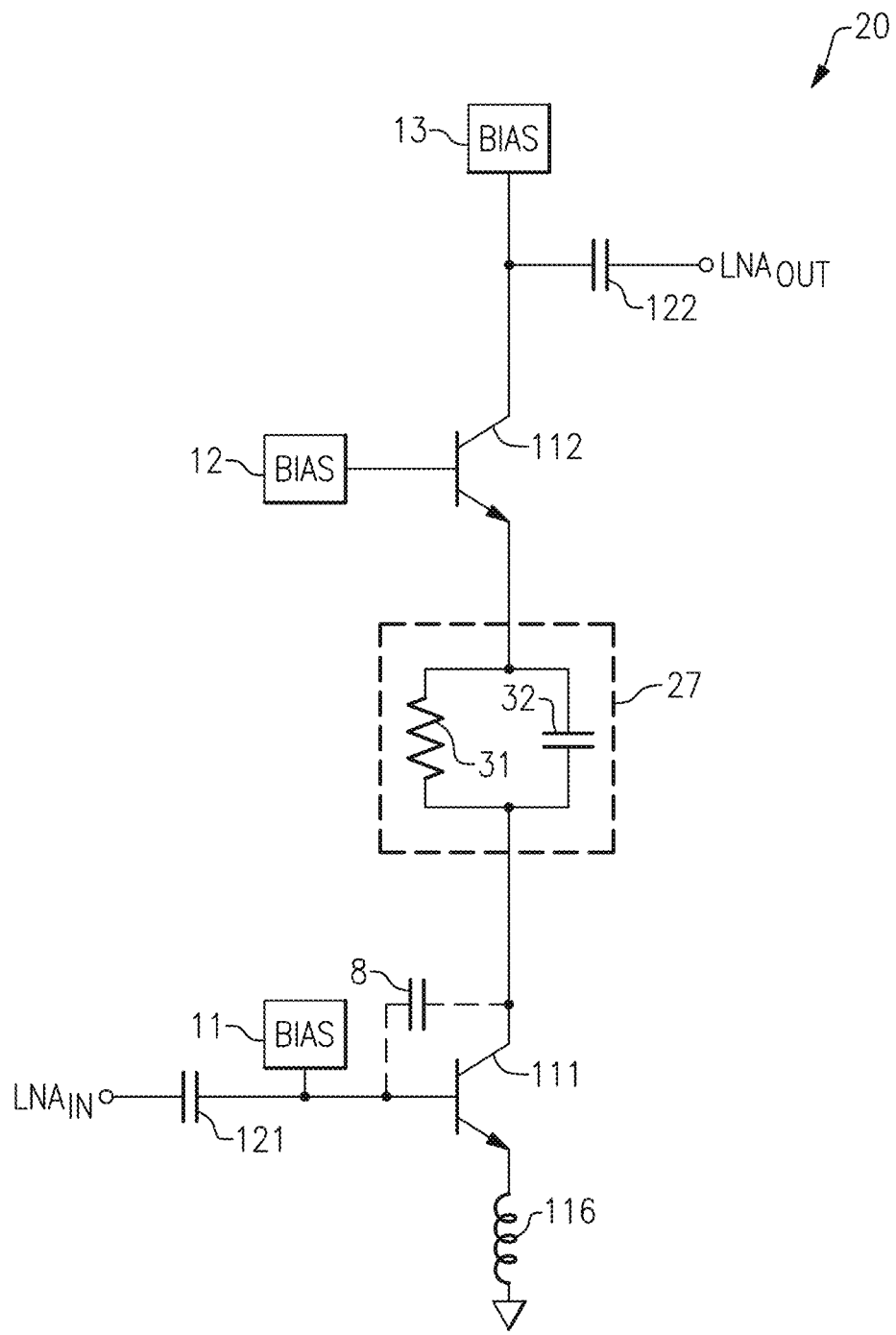
FIG. 2A is a schematic diagram of another embodiment of an LNA with a mid-node impedance network.

FIG. 2A is a schematic diagram of another embodiment of an LNA 20 with a mid-node impedance network. The LNA 20 includes a gm bipolar transistor 111, a cascode bipolar transistor 112, a degeneration inductor 116, an input DC blocking capacitor 121, an output matching capacitor 122, an input bias circuit 11, a cascode bias circuit 12, an output bias circuit 13, and a mid-node impedance network 27. The LNA 20 receives an RF input signal at an input $LNA_{IN}$, and generates an amplified RF signal at an output $LNA_{OUT}$.

The input DC blocking capacitor 121 is electrically connected between the input $LNA_{IN}$ and an input node electrically connected to a base of the gm bipolar transistor 111. The input DC blocking capacitor 121 serves to provide DC voltage blocking that allows the input bias circuit 11 to bias the base of the gm bipolar transistor 111 at a DC voltage that is different than a DC voltage of the input $LNA_{IN}$.

The gm bipolar transistor 111 includes an emitter electrically connected to a degeneration inductor 116. Although FIG. 2A illustrates a configuration in which emitter degeneration is provided using an inductor, other configurations are possible, including, but not limited to, implementations using resistive degeneration, implementations using a combination of resistive and inductive degeneration, and/or implementations without degeneration.

The cascode bipolar transistor 112 includes a base biased by the cascode bias circuit 12. As shown in FIG. 2A, the cascode bipolar transistor 112 operates in a signal path of the LNA 20. In particular, the gm bipolar transistor 111 amplifies the RF input signal received at the input $LNA_{IN}$, and provides an amplified RF signal to the output $LNA_{OUT}$ via the cascode bipolar transistor 112.

As shown in FIG. 2A, the output matching capacitor 122 is electrically connected between the output $LNA_{OUT}$ and an output node electrically connected to the collector of the cascode bipolar transistor 112. The output matching capacitor 122 serves to provide output impedance matching, as well as to provide DC voltage blocking that allows the output bias circuit 13 to bias the collector of the cascode bipolar transistor 112 at a DC voltage that is different than a DC voltage of the output $LNA_{OUT}$. Although FIG. 2A illustrates one implementation of output impedance matching, other configurations are possible.

The illustrated mid-node impedance network 27 is electrically connected between the collector of the gm bipolar transistor 111 and the emitter of the cascode bipolar transistor 112. Additionally, the illustrated mid-node impedance network 27 includes a resistor 31 and a capacitor 32, which are electrically connected in parallel with one another. The parallel combination of the resistor 31 and the capacitor 32 operate in series with respect to a signal path of the LNA 20.

The mid-node impedance network 27 provides compensation for a parasitic capacitance 8, which corresponds to a base-to-collector capacitor of the gm bipolar transistor 111, in this example. The mid-node impedance network 27 provides a variety of benefits, including relaxing a design trade-off between reflection coefficient and gain. Thus, reflection coefficient and gain can be decoupled, thereby permitting greater flexibility in achieving S11 and gain/noise figure specifications.

In one embodiment, the resistor 31 has a resistance in the range of about 50Ω to about 300Ω, for instance, about 183Ω, and the capacitor 32 has a capacitance in the range of about 0.5 pF to about 5 pF, for instance, about 1 pF. Although example frequency, resistance, and capacitance values have been provided, other values are possible.

Figure 2B:
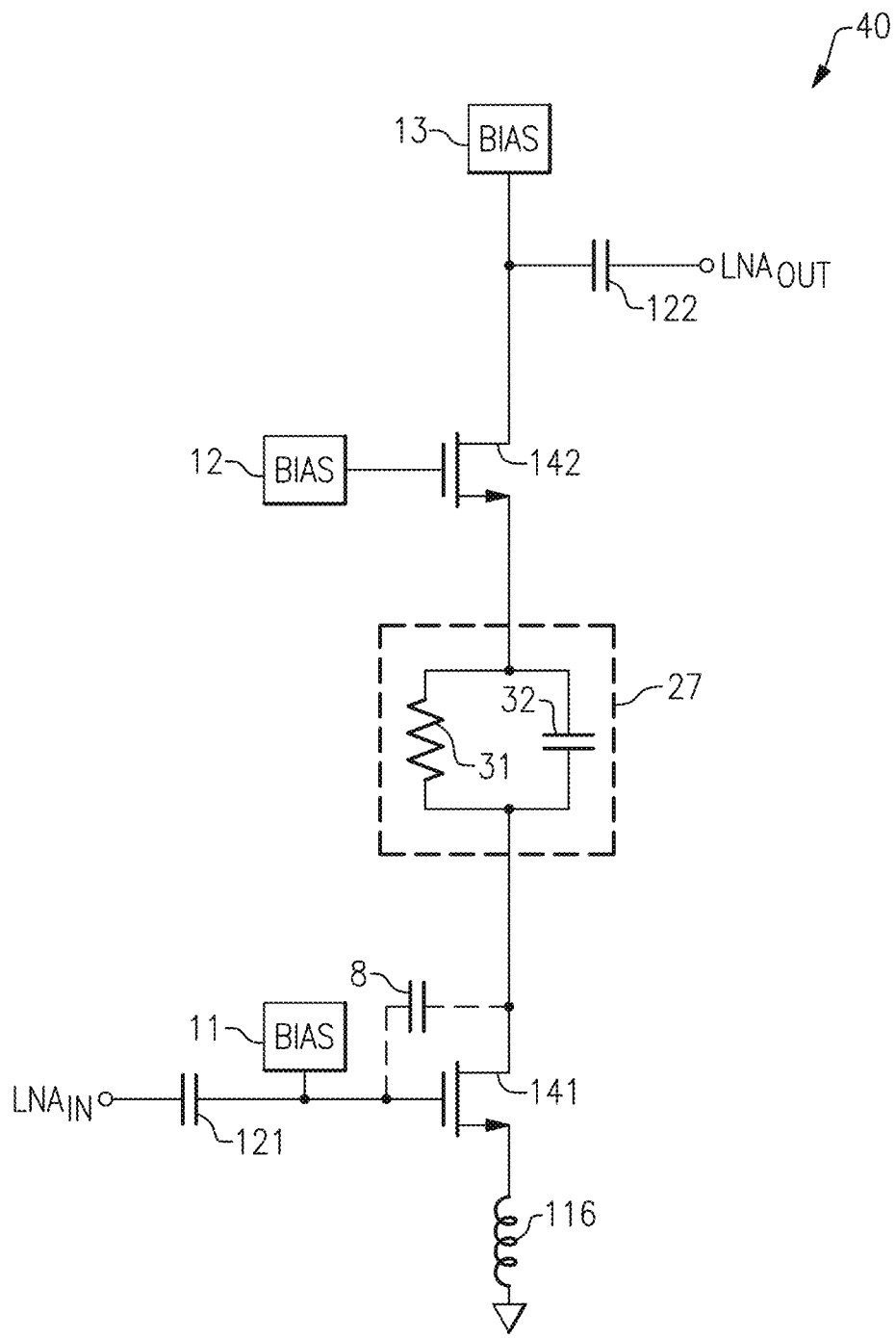
FIG. 2B is a schematic diagram of another embodiment of an LNA with a mid-node impedance network.

FIG. 2B is a schematic diagram of another embodiment of an LNA 40 with a mid-node impedance network. The illustrated LNA 40 includes a gm field-effect transistor (FET) 141, a cascode FET 142, a degeneration inductor 116, an input DC blocking capacitor 121, an output matching capacitor 122, an input bias circuit 11, a cascode bias circuit 12, an output bias circuit 13, and a mid-node impedance network 27. The LNA 40 receives an RF input signal at an input $LNA_{IN}$, and generates an amplified RF signal at an output $LNA_{OUT}$.

The LNA 40 of FIG. 2B is similar to the LNA 20 of FIG. 2A, except that the LNA 40 of FIG. 2B is implemented using FETs rather than bipolar transistors. In particular, the LNA 40 of FIG. 2B omits the gm bipolar transistor 111 and the cascode bipolar transistor 112 of FIG. 2A in favor of including the gm FET 141 and the cascode FET 142. The teachings herein are applicable to configurations using gm devices and cascode devices implemented using bipolar transistors, FETs, or a combination thereof. Moreover, although illustrated in the context of n-type gm and cascode devices, the teachings herein are also applicable to implementations using p-type devices.

Figure 3:
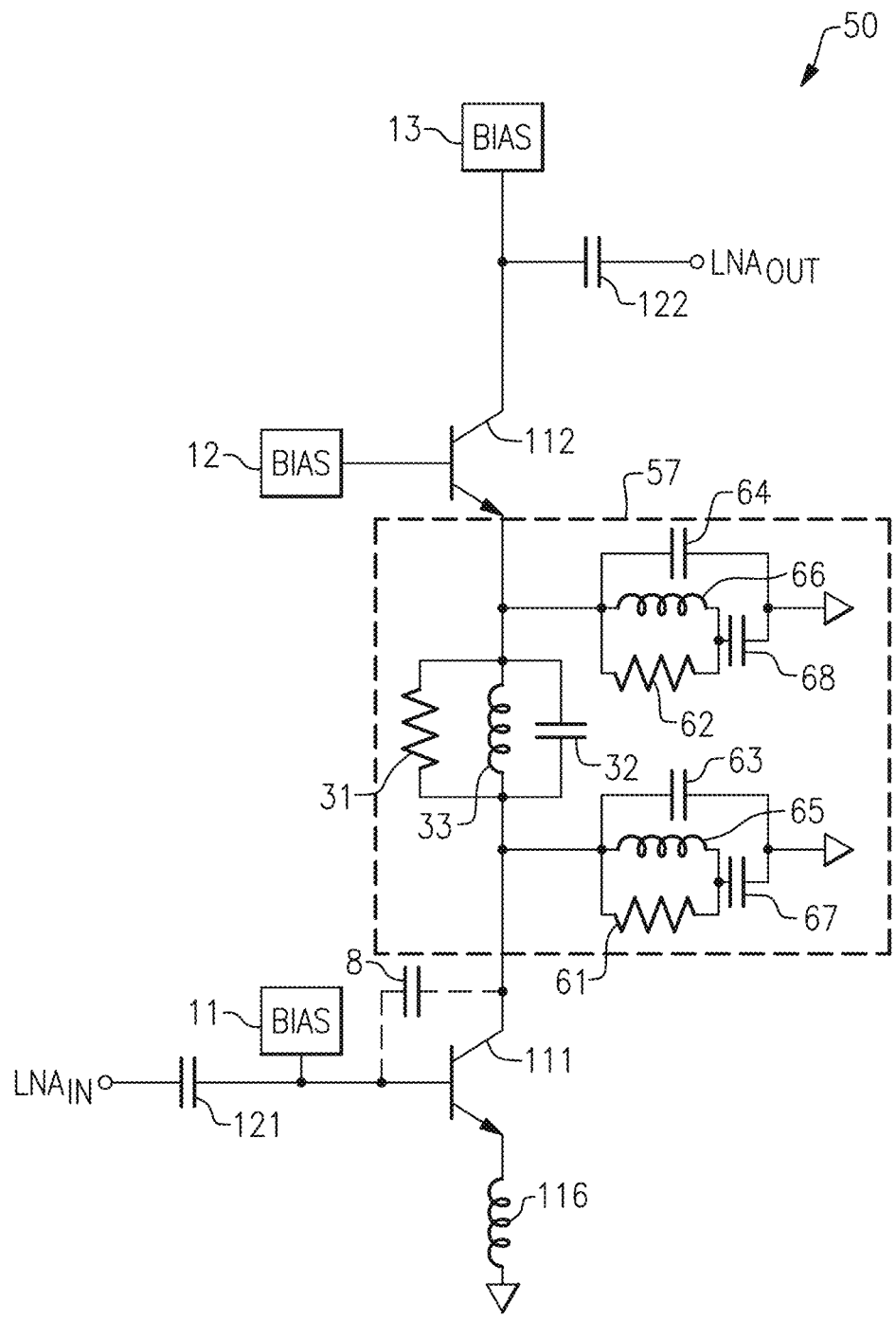
FIG. 3 is a schematic diagram of another embodiment of an LNA with a mid-node impedance network.

FIG. 3 is a schematic diagram of another embodiment of an LNA 50 with a mid-node impedance network. The LNA 50 includes a gm bipolar transistor 111, a cascode bipolar transistor 112, a degeneration inductor 116, an input DC blocking capacitor 121, an output matching capacitor 122, an input bias circuit 11, a cascode bias circuit 12, an output bias circuit 13, and a mid-node impedance network 57. The LNA 50 receives an RF input signal at an input $LNA_{IN}$, and generates an amplified RF signal at an output $LNA_{OUT}$.

The LNA 50 of FIG. 3 is similar to the LNA 20 of FIG. 2A, except that the LNA 50 includes a different configuration of a mid-node impedance network. In particular, the mid-node impedance network 57 of FIG. 3 includes a series resistor 31, a series capacitor 32, a series inductor 33, a first shunt resistor 61, a first DC blocking capacitor 67, a first shunt capacitor 63, a first shunt inductor 65, a second shunt resistor 62, a second DC blocking capacitor 68, a second shunt capacitor 64, and a second shunt inductor 66.

In the illustrated embodiment, the series resistor 31, the series capacitor 32, and the series inductor 33 are electrically connected in parallel with one another, and operate in series with respect to a signal path of the LNA 50. The parallel combination of the series resistor 31, the series capacitor 32, and the series inductor 33 are electrically connected between the collector of the gm bipolar transistor 111 and the emitter of the cascode bipolar transistor 112.

As shown in FIG. 3, the first shunt resistor 61, the first shunt capacitor 63, and the first shunt inductor 65 are electrically connected to a collector of the gm bipolar transistor 111, and operate in shunt with respect to the signal path of the LNA50. Additionally, the second shunt resistor 62, the second shunt capacitor 64, and the second shunt inductor 66 are electrically connected to an emitter of the cascode bipolar transistor 112, and also operate in shunt with respect to the signal path of the LNA50. The first DC blocking capacitor 67 and the second DC blocking capacitor 68 are included in this embodiment to aid in providing desired DC voltages at the collector of the gm bipolar transistor 111 and at the emitter of the cascode bipolar transistor 112.

The illustrated embodiment includes not only an impedance element in series with respect to the LNA's signal path, but also impedance networks in shunt with respect to the LNA's signal path. Including the shunt impedance elements can aid in enhancing performance in certain applications at an expense in an increase in complexity and/or area.

Examples of LNAs with Self-Aligned Biasing

A low noise amplifier (LNA) with very low power consumption can be desirable for a variety of applications. For example, an LNA used in wearable devices and/or internet of things (TOT) applications can be specified to operate with relatively stringent leakage current specifications. For example, such an IOT and/or wearable device can be location-aware, and operate using a positioning system such as a GPS transceiver for which very low power consumption is desired.

Moreover, LNA current specifications can be further constrained in applications that operate without cellular connectivity. For instance, a transceiver for a positioning system may operate with relatively weak cellular blockers and/or relaxed linearity specifications, but also with stringent low current specifications.

A DC biasing scheme of an LNA can impact performance specifications. For example, an LNA can include an input current mirror including a mirror device and a transconductance (gm) device that is a factor of n larger than the mirror device. Additionally, a reference current $I_{REF}$ can be provided to the mirror device, thereby generating a bias current of about $n*I_{REF}$ for the gm device. The larger the value of n, the larger the bias current of the gm device and the higher the LNAs efficiency, since the mirror device does not provide RF gain. Thus, for a given current budget, a gm device has a certain size to achieve a desired current density.

For applications with relatively stringent current specifications, a relatively small bias current $I_{BIAS}$ and a corresponding small gm device can be desired. Thus, small current specifications lead to small gm devices, which in turn lead to small mirror devices. However, the desired value of n can result in a mirror device that is smaller than a minimum transistor size permitted in a particular manufacturing process.

Apparatus and methods for biasing LNAs are provided herein. In certain configurations, an LNA includes an input, an output, a gm device, a cascode device, a bias current source, and a feedback bias circuit. The gm device generates an amplified signal by amplifying an input signal received at the input, and provides the amplified signal to the output via the cascode device. The bias current source generates a bias current that flows through the cascode device and the gm device. The feedback bias circuit provides feedback from the LNA's output to the LNA's input to control an input bias voltage of the gm device.

Accordingly, in certain implementations a DC bias current is provided from a bias current source to a gm device via a cascode device. By avoiding a mirror device at the LNA's input, current loss through the mirror device can be avoided, and lower part-to-part current variation can be achieved. Additionally, a size of the gm device need not be constrained by a ratio n relative to the mirror device, but rather can have a size independently selected to achieve superior low current performance.

Additionally, in certain implementations, an input bias voltage of the gm device is controlled by a feedback bias circuit that is electrically connected between the drain or collector of the cascode device and a gate or base of the gm device. The feedback bias circuit provides an input bias voltage to the gm device that is self-aligned. Accordingly, the gm device's voltage biasing can track process and temperature variations.

In certain configurations, the feedback bias circuit is also used to bias the cascode device. For example, the feedback bias circuit can control a cascode bias voltage provided to a base or gate of the cascode device. Thus, in certain implementations the feedback bias circuit can be used to provide self-biasing of both the gm device and the cascode device.

Figure 4:
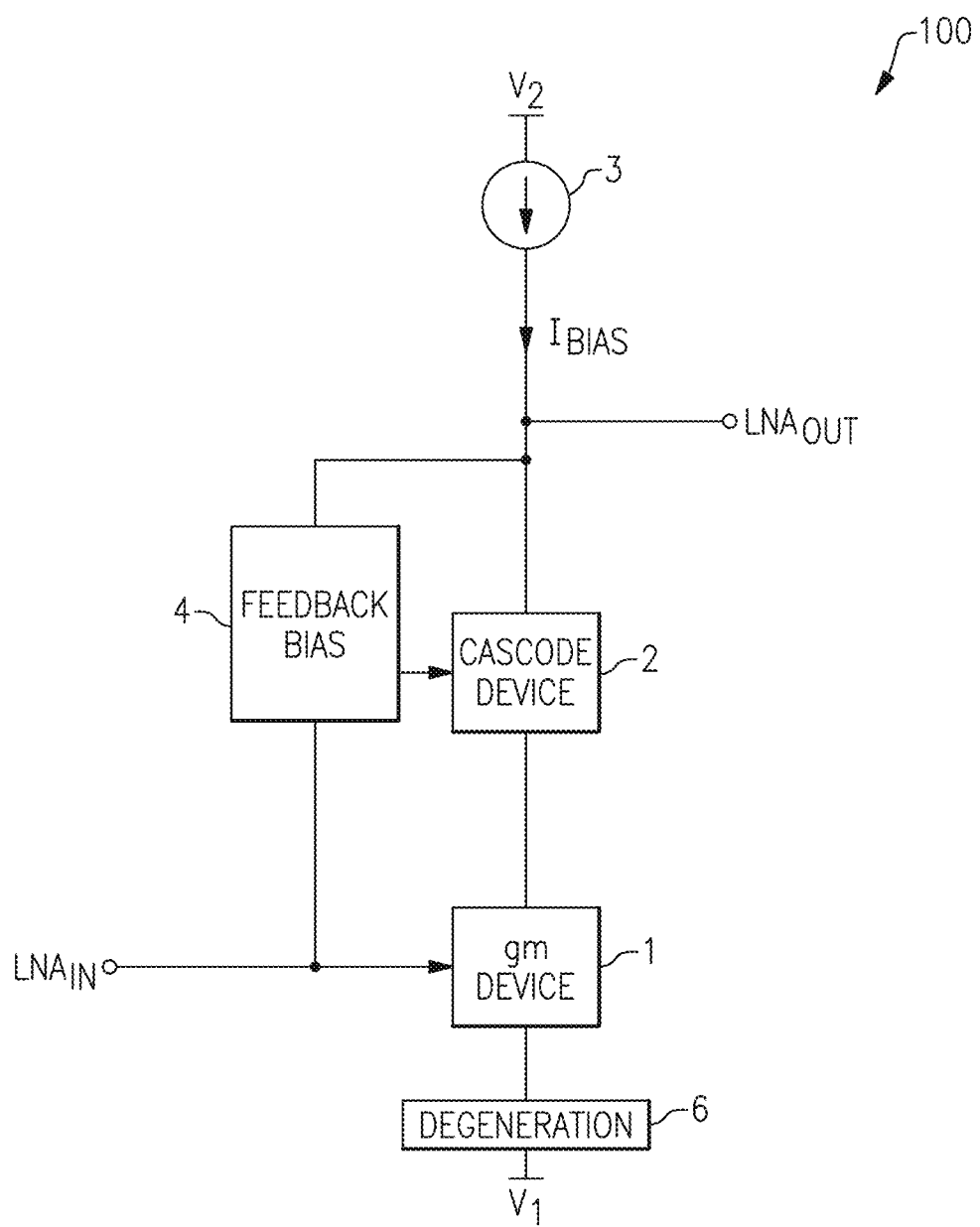
FIG. 4 is a schematic diagram of one embodiment of an LNA with self-aligned biasing.

FIG. 4 is a schematic diagram of one embodiment of an LNA 100 with self-aligned biasing. The LNA 100 includes a gm device 1, a cascode device 2, a bias current source 3, a feedback bias circuit 4, and a degeneration circuit 6.

Although FIG. 4 illustrates one embodiment of an LNA with feedback biasing, the teachings herein are applicable to LNAs implemented in a wide variety of ways. Accordingly, other implementations of LNAs are possible, including, but not limited to, LNAs including more or fewer components and/or a different arrangement of components. In one non-limiting example, an LNA omits a degeneration circuit.

The LNA 100 receives an RF input signal at the input $LNA_{IN}$, and provides an amplified RF signal at the output $LNA_{OUT}$. In certain configurations, the amplified RF signal can be provided from the output $LNA_{OUT}$ to a transceiver. For example, the transceiver can include a demodulator that down-shifts the amplified RF signal to baseband or an intermediate frequency for further processing.

In the illustrated embodiment, the gm device 1 amplifies the RF input signal received at the input $LNA_{IN}$, and provides the amplified RF signal to the output $LNA_{OUT}$ via the cascode device 2. The bias current source 3 generates a bias current $I_{BIAS}$ that flows through the cascode device 2 and the gm device 1.

Thus, the bias current source 3 provides the bias current $I_{BIAS}$ to the gm device 1 through the cascode device 2. By avoiding a mirror device at the input $LNA_{IN}$, current loss through the mirror device can be avoided, and lower part-to-part current variation can be achieved. Additionally, a size of the gm device 1 need not be constrained by a scaling ratio relative to a mirror device, but rather can have a size independently selected to achieve superior low current performance and/or a desired current density.

The feedback bias circuit 4 provides feedback from the output $LNA_{OUT}$ to the input $LNA_{IN}$ to control an input bias voltage of the gm device 1. By using the feedback bias circuit 4 to control the gm device's input bias voltage, biasing is self-aligned and tracks process and temperature variations.

In the illustrated embodiment, the feedback bias circuit 4 also provides a cascode bias voltage to the cascode device 2.

Implementing the feedback bias circuit 4 in this manner can further enhance biasing performance by self-aligning biasing of both the gm device 1 and the cascode device 2. Additionally, implementing the feedback bias circuit 4 in this manner also provides radio frequency isolation, which enhances stability by preventing degradation of reverse isolation performance.

The degeneration circuit 6 can improve input impedance matching, enhance stability, and/or increase the LNA's linearity. In one example, the gm device 1 is implemented using a bipolar transistor, and the degeneration circuit 6 provides emitter degeneration. In another example, the gm device 1 is implemented using a FET, and the degeneration circuit 6 provides source degeneration. In one embodiment, the degeneration circuit 6 includes at least one of an inductor or a resistor.

In the illustrated embodiment, a first voltage $V_1$ and a second voltage $V_2$ are used to power the LNA 100. The first voltage $V_1$ can be, for example, ground, and the second voltage $V_2$ can be, for example, a power supply voltage. However, other implementations are possible.

Figure 5A:
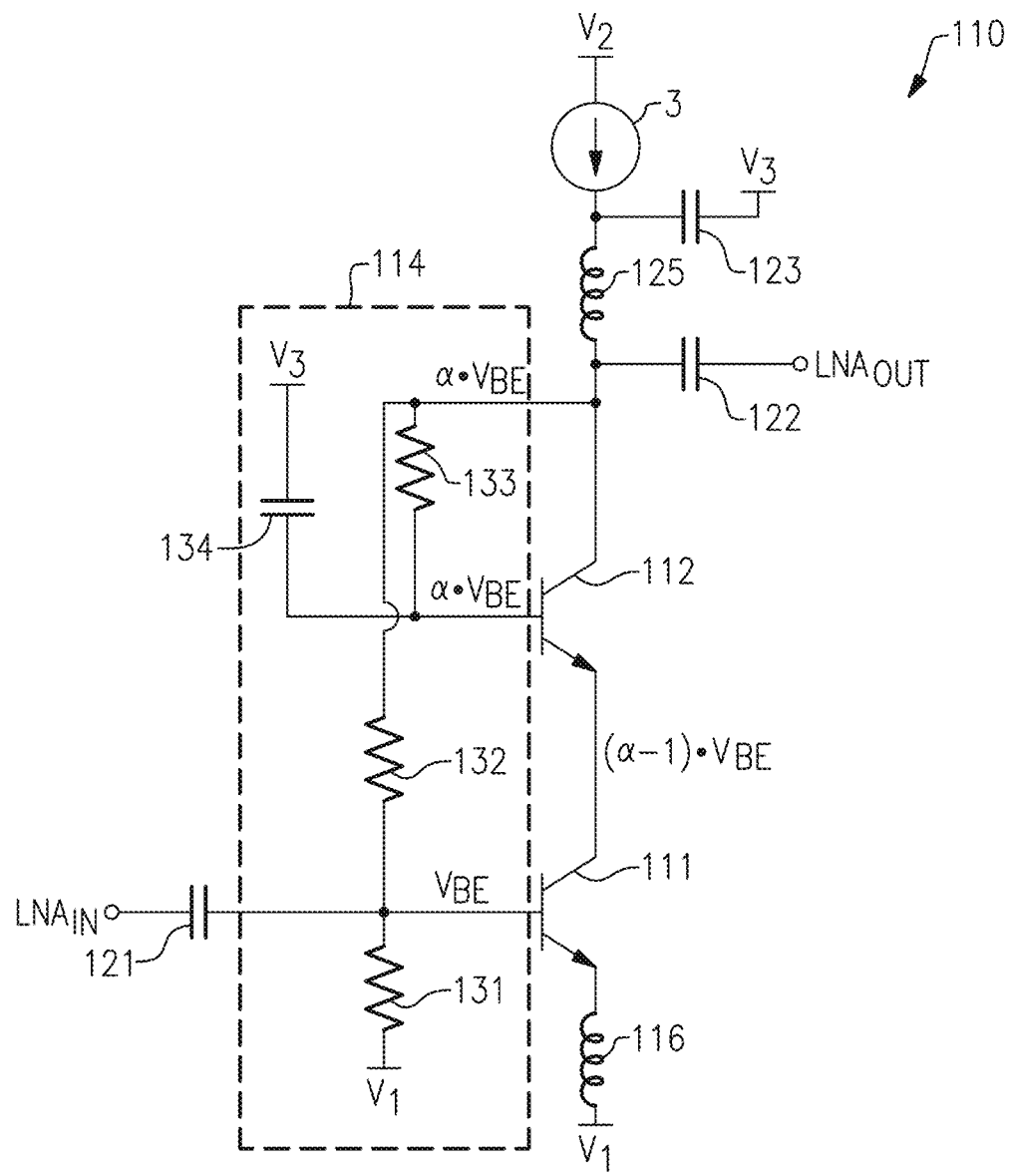
FIG. 5A is a schematic diagram of another embodiment of an LNA with self-aligned biasing.

FIG. 5A is a schematic diagram of another embodiment of an LNA 110 with self-aligned biasing. The illustrated LNA 110 includes a gm bipolar transistor 111, a cascode bipolar transistor 112, a bias current source 3, a feedback bias circuit 114, a degeneration inductor 116, an input DC blocking capacitor 121, an output matching capacitor 122, a filtering capacitor 123, and an output matching inductor 125. The LNA 110 receives an RF input signal at an input $LNA_{IN}$, and generates an amplified RF signal at an output $LNA_{OUT}$.

The input DC blocking capacitor 121 is electrically connected between the input $LNA_{IN}$ and an input node that is electrically connected to a base of the gm bipolar transistor 111. The input DC blocking capacitor 121 serves to provide DC voltage blocking that allows the feedback bias circuit 114 to bias the base of the gm bipolar transistor 111 at a DC voltage that is different than a DC voltage of the input $LNA_{IN}$.

The gm bipolar transistor 111 includes an emitter electrically connected to a first voltage $V_1$ through a degeneration inductor 116. In certain implementations, the first voltage $V_1$ corresponds to a ground voltage. However, other configurations are possible. Although FIG. 5A illustrates a configuration in which emitter degeneration is provided using an inductor, other configurations are possible, including, but not limited to, implementations using resistive degeneration, implementations using a combination of resistive and inductive degeneration, and implementations without degeneration.

The cascode bipolar transistor 112 includes a base and a collector biased by the feedback bias circuit 114. As shown in FIG. 5A, the cascode bipolar transistor 112 operates in a signal path of the LNA 110. In particular, the gm bipolar transistor 111 amplifies the RF input signal received at the input $LNA_{IN}$, and provides an amplified RF signal to the output $LNA_{OUT}$ via the cascode bipolar transistor 112.

As shown in FIG. 5A, the output matching capacitor 122 is electrically connected between the output $LNA_{OUT}$ and an output node that is electrically connected to the collector of the cascode bipolar transistor 112. Additionally, the output matching inductor 125 is electrically connected between the collector of the cascode bipolar transistor 112 and an output of the bias current source 3. The output matching capacitor 122 and the output matching inductor 125 serve to provide output impedance matching. Additionally, the output matching capacitor 122 allows the bias voltage at the collector of the cascode bipolar transistor 112 to be at a different DC voltage than the output $LNA_{OUT}$. Although FIG. 5A illustrates one implementation of output impedance matching, other configurations are possible.

The bias current source 3 generates a bias current, which is used to bias the cascode bipolar transistor 112 and the gm bipolar transistor 111. In particular, a portion of the bias current flows through the bipolar transistor 112 and the gm bipolar transistor 111. The illustrated embodiment further includes the filtering capacitor 123, which provides an AC ground at the output of the bias current source 3. However, other implementations are possible.

In certain configurations, the bias current source 3 is implemented as a p-type field-effect transistor (PFET), such as a p-type metal oxide semiconductor (PMOS) transistor. However the bias current source 3 can be implemented in other ways.

The illustrated feedback bias circuit 114 includes a first biasing resistor 131, a second biasing resistor 132, a third biasing resistor 133, and an RF shunt capacitor 134. As shown in FIG. 5A, the first biasing resistor 131 is electrically connected between a base of the gm bipolar transistor 111 and the first voltage $V_1$. Additionally, the second biasing resistor 132 is electrically connected between the base of the gm bipolar transistor 111 and the collector of the cascode bipolar transistor 112. Furthermore, the third biasing resistor 133 is electrically connected between the collector and the base of the cascode bipolar transistor 112. Additionally, the RF shunt capacitor 134 is electrically connected between the base of the cascode bipolar transistor 112 and a third voltage $V_3$, and serves as a shunt to high frequency signals.

Rather than using an input current mirror, the illustrated LNA 110 uses the bias current source 3 to generate a bias current that flows through the cascode bipolar transistor 112 and the gm bipolar transistor 111. Additionally, the LNA 110 includes the feedback bias circuit 114, which self-aligns the bias voltages of the gm bipolar transistor 111 and the cascode bipolar transistor 112 to maintain sufficient voltage headroom, even in the presence of process and/or temperature variations.

For example, the feedback bias circuit 114 controls the base of the gm bipolar transistor 111 to a voltage $V_{BE}$, where $V_{BE}$ is a base-to-emitter turn-on voltage of the gm bipolar transistor 111. Thus, the feedback bias circuit 114 controls the gm bipolar transistor's base voltage to a DC bias voltage sufficient to turn on the device. The voltage $V_{BE}$ changes with temperature and process, thereby maintain the gm bipolar transistor 111 turned on in the presence of variation.

Additionally, a current about equal to $V_{BE}/R1$ flows through the first biasing resistor 131, where R1 is a resistance of the first biasing resistor 131. For example, the beta of the bipolar transistors can be relatively high, such that the bipolar transistors' base currents are relatively low, for instance, about 0 mA. Thus, a current about equal to $V_{BE}/R1$ can flow through the second biasing resistor 132, and the feedback bias circuit 114 controls a voltage of the collector of the cascode bipolar transistor 112 to be about equal to $\alpha*V_{BE}$, where a is (R1+R2)/R1, and R2 is a resistance of the second biasing resistor 132. In the illustrated embodiment the resistance of the third biasing resistor 133 is also relatively large, and thus the base voltage of the cascode bipolar transistor 112 is about equal to $\alpha*V_{BE}$.

The third biasing resistor 133 aids in providing DC biasing to the cascode bipolar transistor 112, while also providing RF isolation between the base and collector. In one embodiment, the third biasing resistor 133 has a resistance in the range of about 10 kΩ to about 1,000 kΩ However, the third biasing resistor 133 can have other resistance values, such as a resistance value selected based on application and/or implementation.

Since the cascode bipolar transistor 112 also operates with a base-to-emitter turn-on voltage that is about equal to $V_{BE}$, the emitter voltage of the cascode bipolar transistor 112 and the collector voltage of the gm bipolar transistor 111 is about equal to $(\alpha-1)*V_{BE}$.

Thus, the illustrated embodiment operates with resistive feedback to control the bias voltages of the gm bipolar transistor 111 and the cascode bipolar transistor 112 to dynamically track the bipolar transistors' base-to-emitter turn-on voltage. Accordingly, as $V_{BE}$ varies with temperature and/or process, the feedback bias circuit 114 controls the transistor's bias voltages to maintain sufficient voltage headroom. Additionally, a bias current, and thus current density, of the bipolar transistors is controlled using the bias current source 3.

Accordingly, in the illustrated embodiment, the bias current of the gm bipolar transistor 111 and the cascode bipolar transistor 112 are controllable to a desired value using the bias current source 3, and the feedback bias circuit 114 provides feedback to control the transistors' bias voltages to DC voltage levels sufficient to maintain voltage headroom.

By selecting the ratio of R2 to R1, a desired amount of nominal voltage headroom of the gm bipolar transistor 111 can be controlled. In one embodiment, R1 is about k*R2, where k is selected to be in the range of about 0.5 to about 5, for example, about 2.

In one embodiment, the first biasing resistor 131 has a resistance in the range of about 10 kΩ to about 1,000 kΩ, for instance, about 100 kΩ, and the second biasing resistor 132 has a resistance in the range of about 10 kΩ to about 1,000 kΩ, for instance, about 60 kΩ However, other resistance values are possible, such as resistances value selected based on application and/or implementation.

Figure 5B:
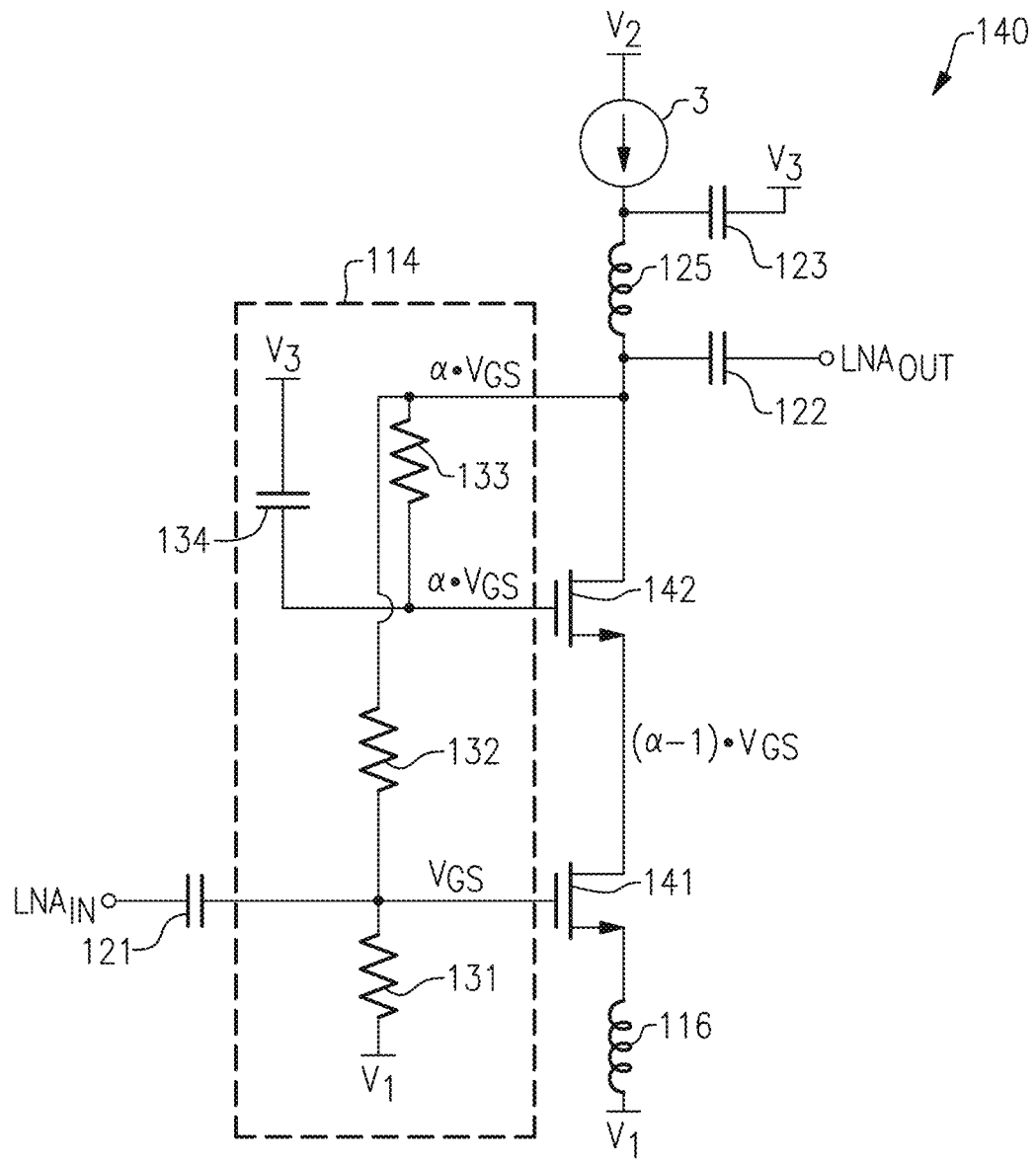
FIG. 5B is a schematic diagram of another embodiment of an LNA with self-aligned biasing.

FIG. 5B is a schematic diagram of another embodiment of an LNA 140 with self-aligned biasing. The illustrated LNA 140 includes a gm field-effect transistor (FET) 141, a cascode FET 142, a bias current source 3, a feedback bias circuit 114, a degeneration inductor 116, an input DC blocking capacitor 121, an output matching capacitor 122, a filtering capacitor 123, and an output matching inductor 125.

The LNA 140 of FIG. 5B is similar to the LNA 110 of FIG. 5A, except that the LNA 140 of FIG. 5B is implemented using FETs rather than bipolar transistors. In particular, the LNA 140 of FIG. 5B omits the gm bipolar transistor 111 and the cascode bipolar transistor 112 of FIG. 5A in favor of including the gm FET 141 and the cascode FET 142. The teachings herein are applicable to configurations using gm devices and cascode devices implemented using bipolar transistors, FBI's, or a combination thereof. Moreover, although illustrated in the context of n-type gm and cascode devices, the teachings herein are also applicable to implementations using p-type devices.

As shown in FIG. 5B, the feedback bias circuit 114 controls the gate voltage of the gm FET 141 to be about equal to $V_{GS}$, where $V_{GS}$ is the gate-to-source turn-on voltage of the gm FET 141. Additionally, the feedback bias circuit 114 controls the gate and drain voltages of the cascode FET 142 to be about equal to $\alpha*V_{GS}$, and controls the source voltage of the cascode FET 142 and the drain voltage of the gm FET 141 to be about equal to $(\alpha-1)*V_{GS}$.

Accordingly, the illustrated embodiment operates with resistive feedback to control the bias voltages of the gm FET 141 and the cascode FET 142 to dynamically track the transistors' gate-to-source turn-on voltage. Accordingly, as $V_{GS}$ varies with temperature and/or process, the feedback bias circuit 114 controls the transistor's bias voltages to maintain sufficient voltage headroom. Additionally, a current of the bias current source 3 controls a current density of the gm FET 141. Thus, both desired current density and sufficient voltage headroom can be achieved.

Figure 5C:
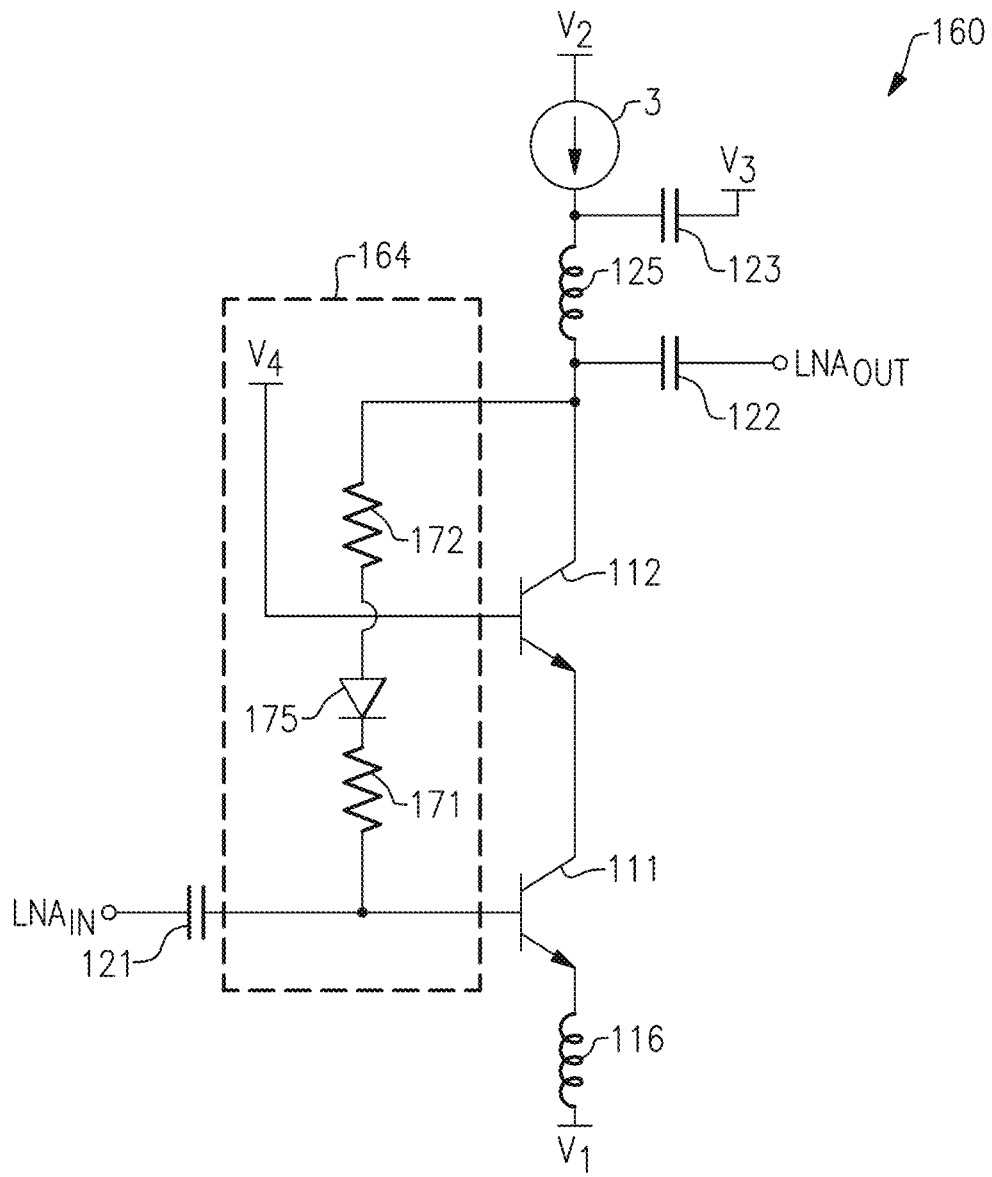
FIG. 5C is a schematic diagram of another embodiment of an LNA with self-aligned biasing.

FIG. 5C is a schematic diagram of another embodiment of an LNA 160 with self-aligned biasing. The illustrated LNA 160 includes a gm bipolar transistor 111, a cascode bipolar transistor 112, a bias current source 3, a feedback bias circuit 164, a degeneration inductor 116, an input DC blocking capacitor 121, an output matching capacitor 122, a filtering capacitor 123, and an output matching inductor 125.

The LNA 160 of FIG. 5C is similar to the LNA 110 of FIG. 5A, except that the LNA 160 includes a different configuration of a feedback bias circuit. In particular, the feedback bias circuit 164 of FIG. 5C includes a first RF isolation resistor 171, a biasing diode 175, and a second RF isolation resistor 172. As shown in FIG. 5C, the first RF isolation resistor 171 is electrically connected between the base of the gm bipolar transistor 111 and a cathode of the biasing diode 175, and the second RF isolation resistor 172 is electrically connected between the collector of the cascode bipolar transistor 112 and an anode of the biasing diode 175. Additionally, the feedback bias circuit 164 biases a base of the cascode bipolar transistor 112 with a fourth voltage $V_4$.

The first and second RF isolation resistors 171, 172 provide resistance that isolates the biasing diode 175 from RF signaling at the input node and/or output node. In one embodiment, the first RF isolation resistor 171 has a resistance in the range of about 10 kΩ to about 200 kΩ, and the second RF isolation resistor 172 has a resistance in the range of about 10 kΩ to about 200 kΩ However, other resistance values are possible, such as resistances value selected based on application and/or implementation.

In one embodiment, the feedback bias circuit 164 biases base of the gm bipolar transistor 111 with a bias voltage about equal to $V_{BE}$, and biases the collector of the cascode bipolar transistor 112 with a bias voltage about equal to $2*V_{BE}$.

Figure 5D:
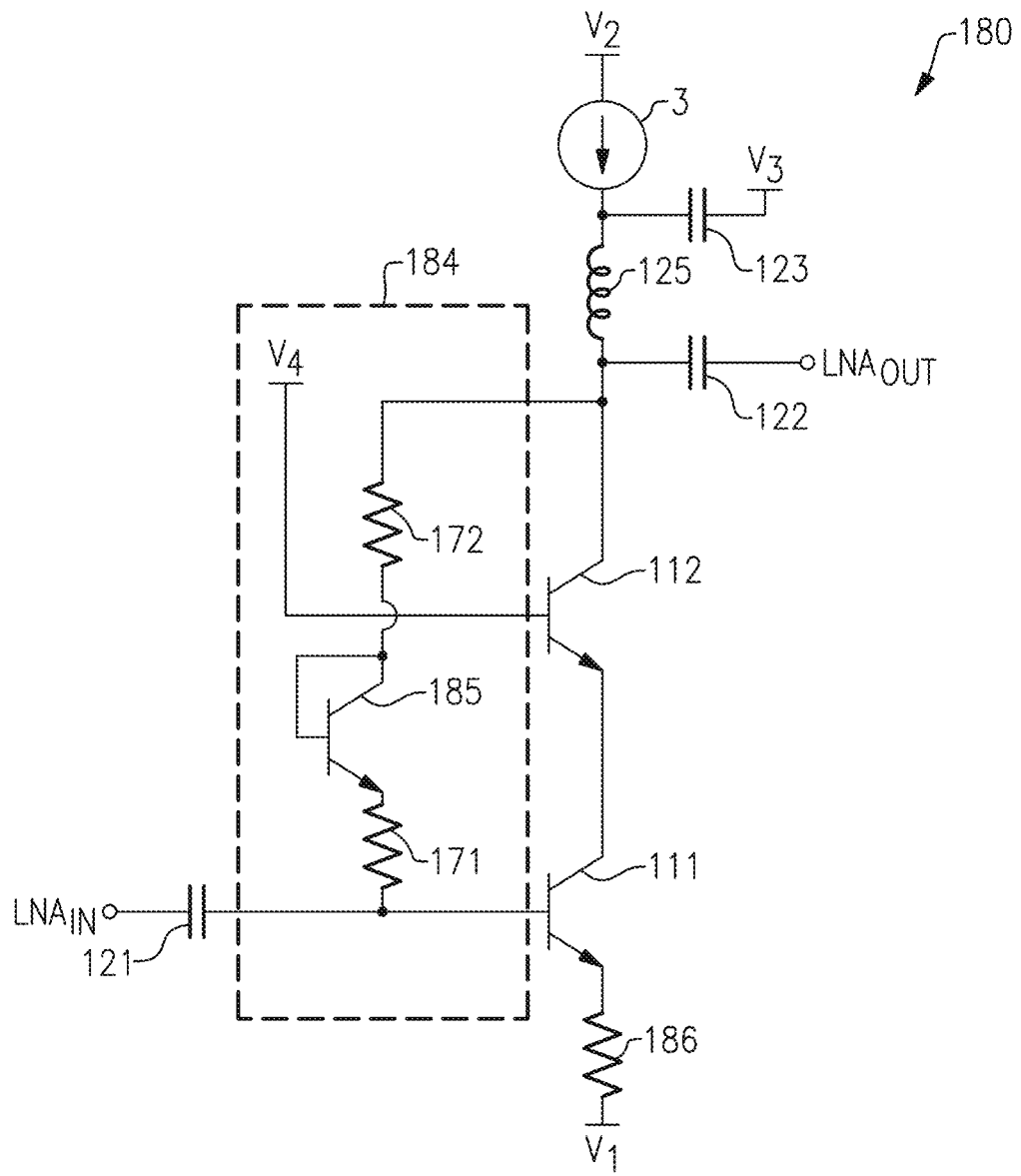
FIG. 5D is a schematic diagram of another embodiment of an LNA with self-aligned biasing.

FIG. 5D is a schematic diagram of another embodiment of an LNA 180 with self-aligned biasing. The illustrated LNA 180 includes a gm bipolar transistor 111, a cascode bipolar transistor 112, a bias current source 3, a feedback bias circuit 184, a degeneration resistor 186, an input DC blocking capacitor 121, an output matching capacitor 122, a filtering capacitor 123, and an output matching inductor 125.

The LNA 180 of FIG. 5D is similar to the LNA 160 of FIG. 5C, except that the LNA 180 includes a different configuration of degeneration and a different configuration of a feedback bias circuit.

For example, the LNA 180 of FIG. 5D includes resistive degeneration using the degeneration resistor 186 shown in FIG. 5D, rather than inductive degeneration using the degeneration inductor 116 shown in FIG. 5C. However, other configurations are possible, such as implementations using inductive degeneration, implementations using a combination of inductive and resistive degeneration, and implementations without degeneration.

The feedback bias circuit 184 of FIG. 5D is similar to the feedback bias circuit 164 of FIG. 5C, except that the feedback bias circuit 184 includes a specific bias diode implementation. In particular, the feedback bias circuit 184 includes a diode-connected bipolar transistor 185. As shown in FIG. 5D, the first RF isolation resistor 171 is electrically connected between the base of the gm bipolar transistor 111 and the emitter of the diode-connected bipolar transistor 185. Additionally, the second RF isolation resistor 172 is electrically connected between the collector of the cascode bipolar transistor 112 and the base/collector of the diode-connected bipolar transistor 185.

Figure 5E:
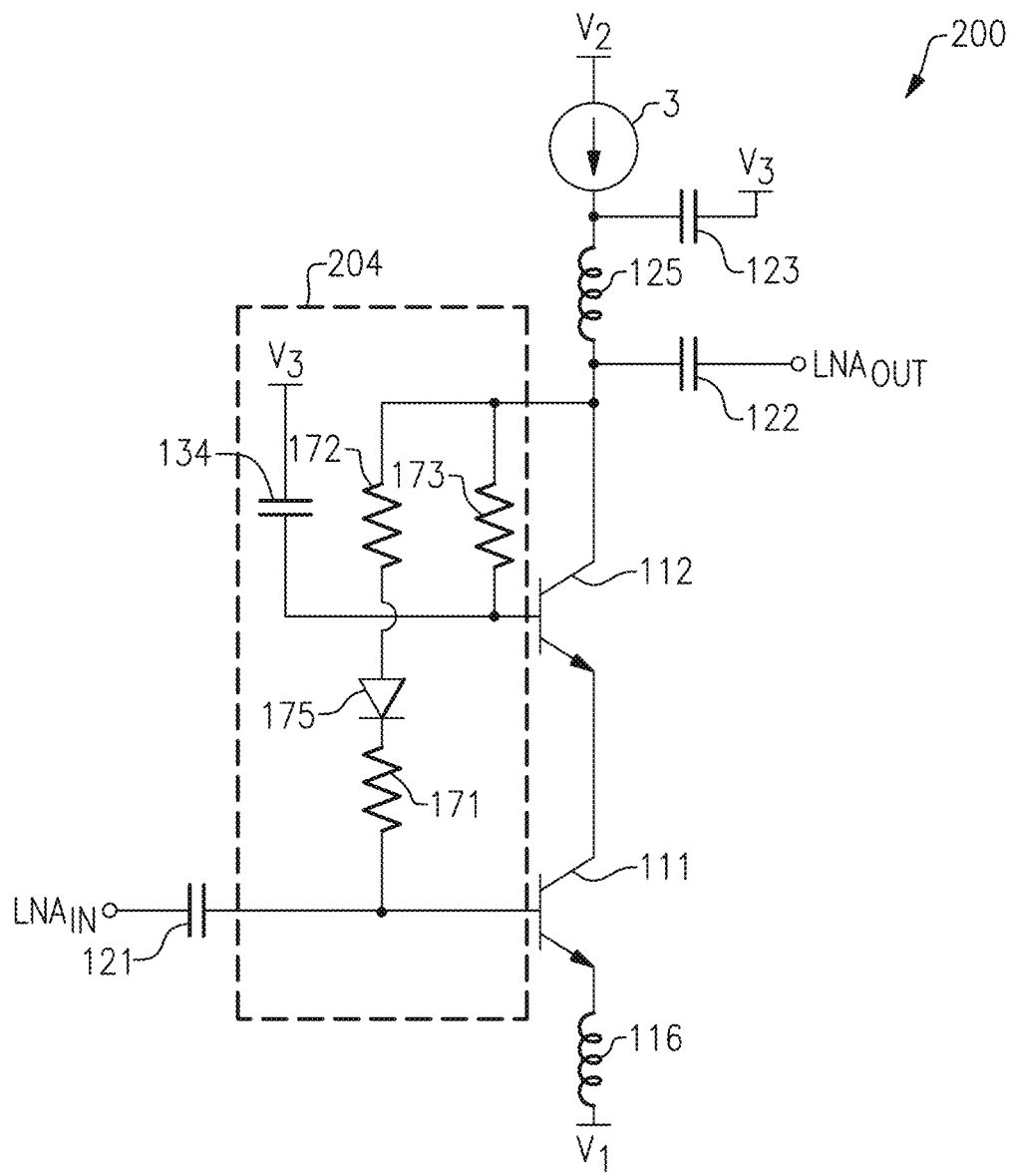
FIG. 5E is a schematic diagram of another embodiment of an LNA with self-aligned biasing.

FIG. 5E is a schematic diagram of another embodiment of an LNA 200 with self-aligned biasing. The illustrated LNA 200 includes a gm bipolar transistor 111, a cascode bipolar transistor 112, a bias current source 3, a feedback bias circuit 204, a degeneration inductor 116, an input DC blocking capacitor 121, an output matching capacitor 122, a filtering capacitor 123, and an output matching inductor 125.

The LNA 200 of FIG. 5E is similar to the LNA 160 of FIG. 5C, except that the LNA 200 includes a different configuration of a feedback bias circuit.

The feedback bias circuit 204 of FIG. 5E is similar to the feedback bias circuit 164 of FIG. 5C, except that the feedback bias circuit 200 includes a different configuration of biasing the base of the cascode bipolar transistor 112. In the illustrated embodiment, the feedback bias circuit 204 includes the first RF isolation resistor 171, the second RF isolation resistor 172, and the biasing diode 175, which can be as described earlier. Additionally, the feedback bias circuit 204 further includes a biasing resistor 173, which is used to bias a base voltage of the cascode bipolar transistor 112 based on the collector voltage of the cascode bipolar transistor 112. Additionally, the feedback bias circuit 204 includes an RF shunt capacitor 134, which is electrically connected between the base of the cascode bipolar transistor 112 and the third voltage $V_3$, and serves to shunt high frequency signals.

In one embodiment, the biasing resistor 173 has a resistance in the range of about 10 kΩ to about 200 kΩ However, the biasing resistor 173 can have other resistance values, such as a resistance value selected based on application and/or implementation.

Figure 5F:
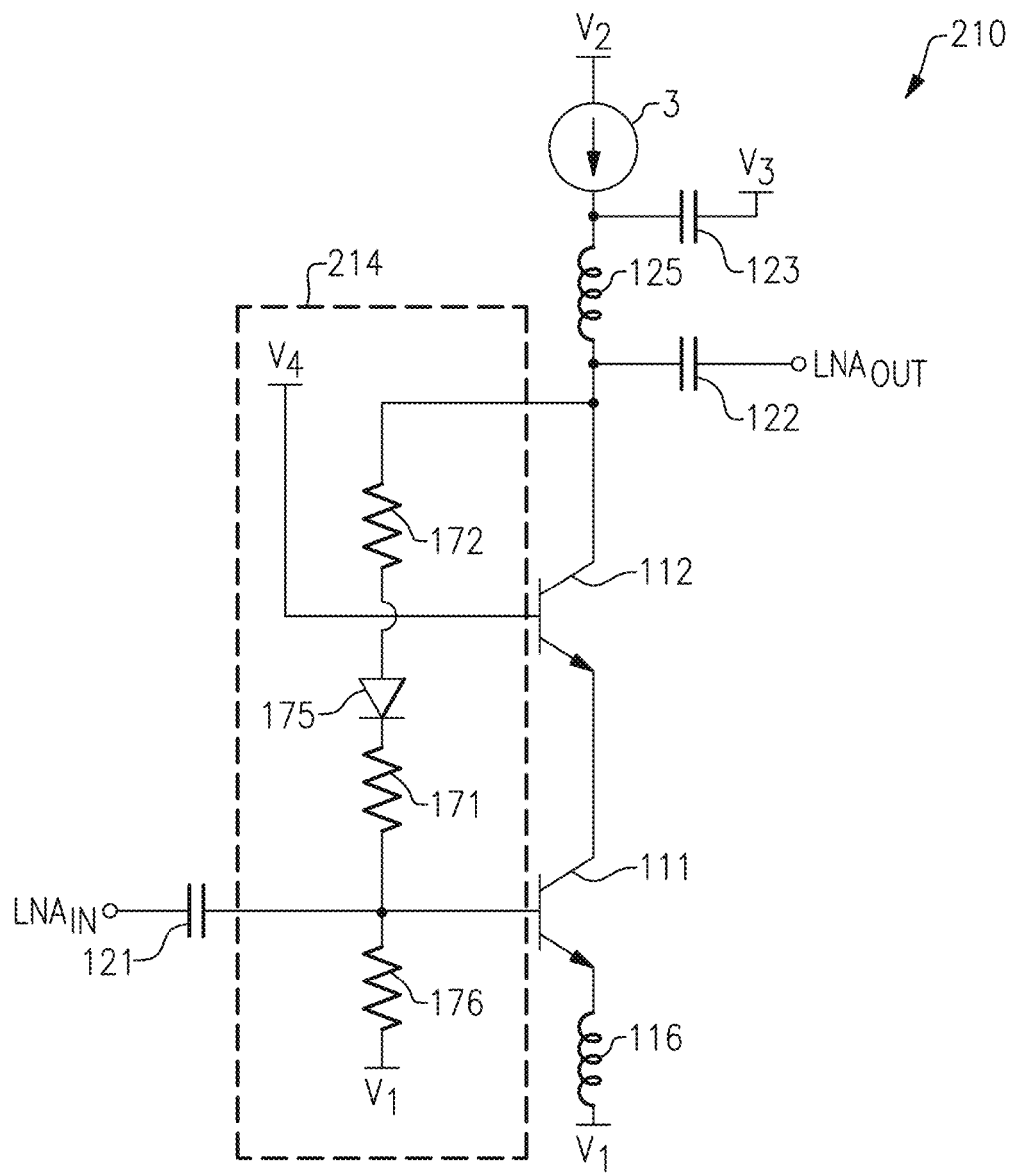
FIG. 5F is a schematic diagram of another embodiment of an LNA with self-aligned biasing.

FIG. 5F is a schematic diagram of another embodiment of an LNA 210 with self-aligned biasing. The illustrated LNA 210 includes a gm bipolar transistor 111, a cascode bipolar transistor 112, a bias current source 3, a feedback bias circuit 214, a degeneration inductor 116, an input DC blocking capacitor 121, an output matching capacitor 122, a filtering capacitor 123, and an output matching inductor 125.

The LNA 210 of FIG. 5F is similar to the LNA 160 of FIG. 5C, except that the LNA 210 includes a different configuration of a feedback bias circuit.

The feedback bias circuit 214 of FIG. 5F is similar to the feedback bias circuit 164 of FIG. 5C, except that the feedback bias circuit 214 further includes a current controlling resistor 176, which is electrically connected between the base of the gm bipolar transistor 111 and the first voltage $V_1$. The current controlling resistor 176 helps control an amount of current flowing through the feedback bias circuit 214 from the collector of the cascode bipolar transistor 112 to the first voltage $V_1$ via the base of the gm bipolar transistor 111.

In one embodiment, the current controlling resistor 176 has a resistance in the range of about 10 kΩ to about 200 kΩ However, the current controlling resistor 176 can have other resistance values, such as a resistance value selected based on application and/or implementation.

Figure 5G:
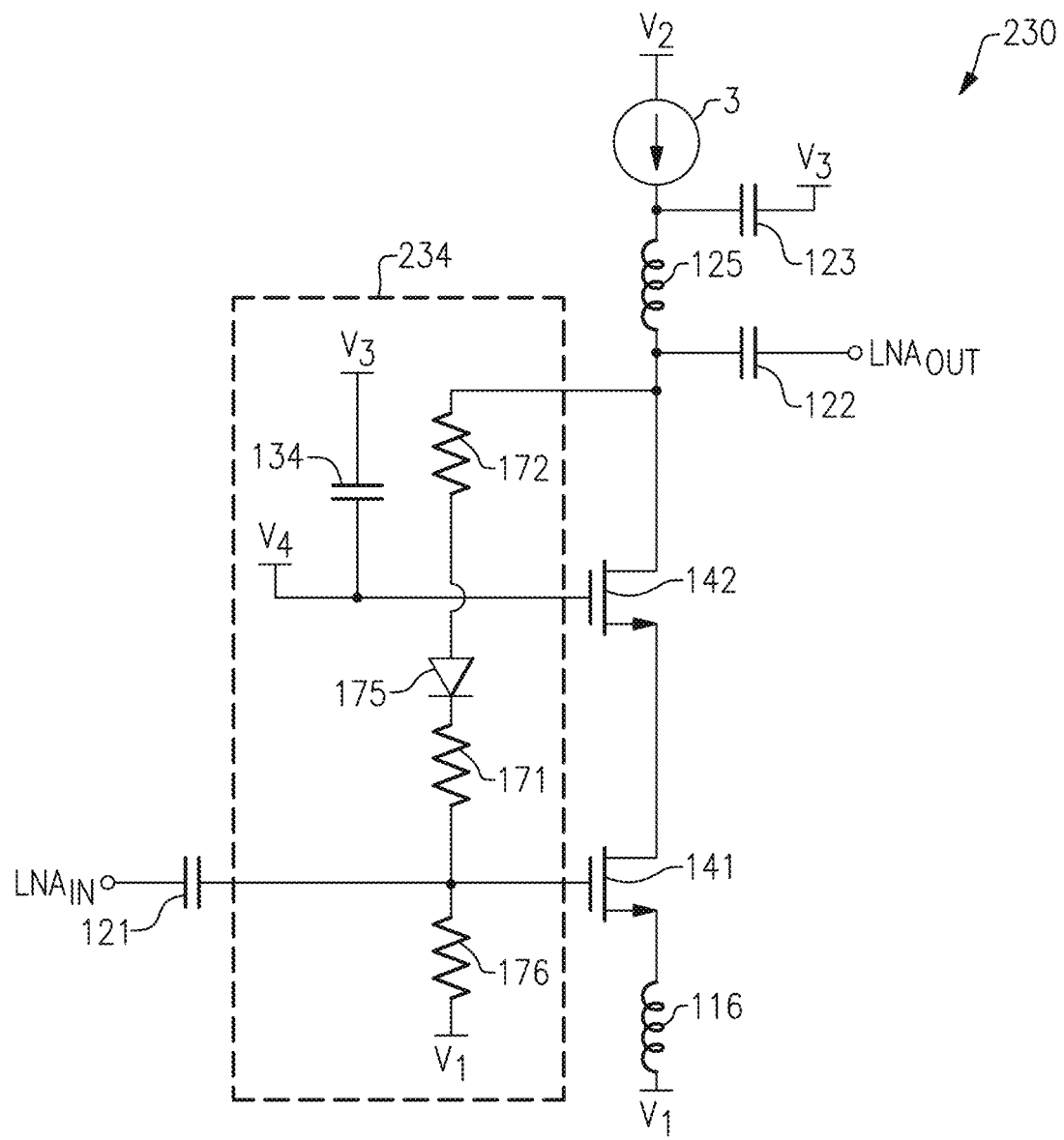
FIG. 5G is a schematic diagram of another embodiment of an LNA with self-aligned biasing.

FIG. 5G is a schematic diagram of another embodiment of an LNA 230 with self-aligned biasing. The illustrated LNA 230 includes a gm FET 141, a cascode FET 142, a bias current source 3, a feedback bias circuit 234, a degeneration inductor 116, an input DC blocking capacitor 121, an output matching capacitor 122, a filtering capacitor 123, and an output matching inductor 125.

The LNA 230 of FIG. 5G is similar to the LNA 210 of FIG. 5F, except that the LNA 230 includes a configuration of a feedback bias circuit 234 that further includes an RF shunt capacitor 134. Additionally, the LNA 230 of FIG. 5G includes the gm FET 141 and the cascode FET 142, rather than the gm bipolar transistor 111 and the cascode bipolar transistor 112, respectively.

Figure 6:
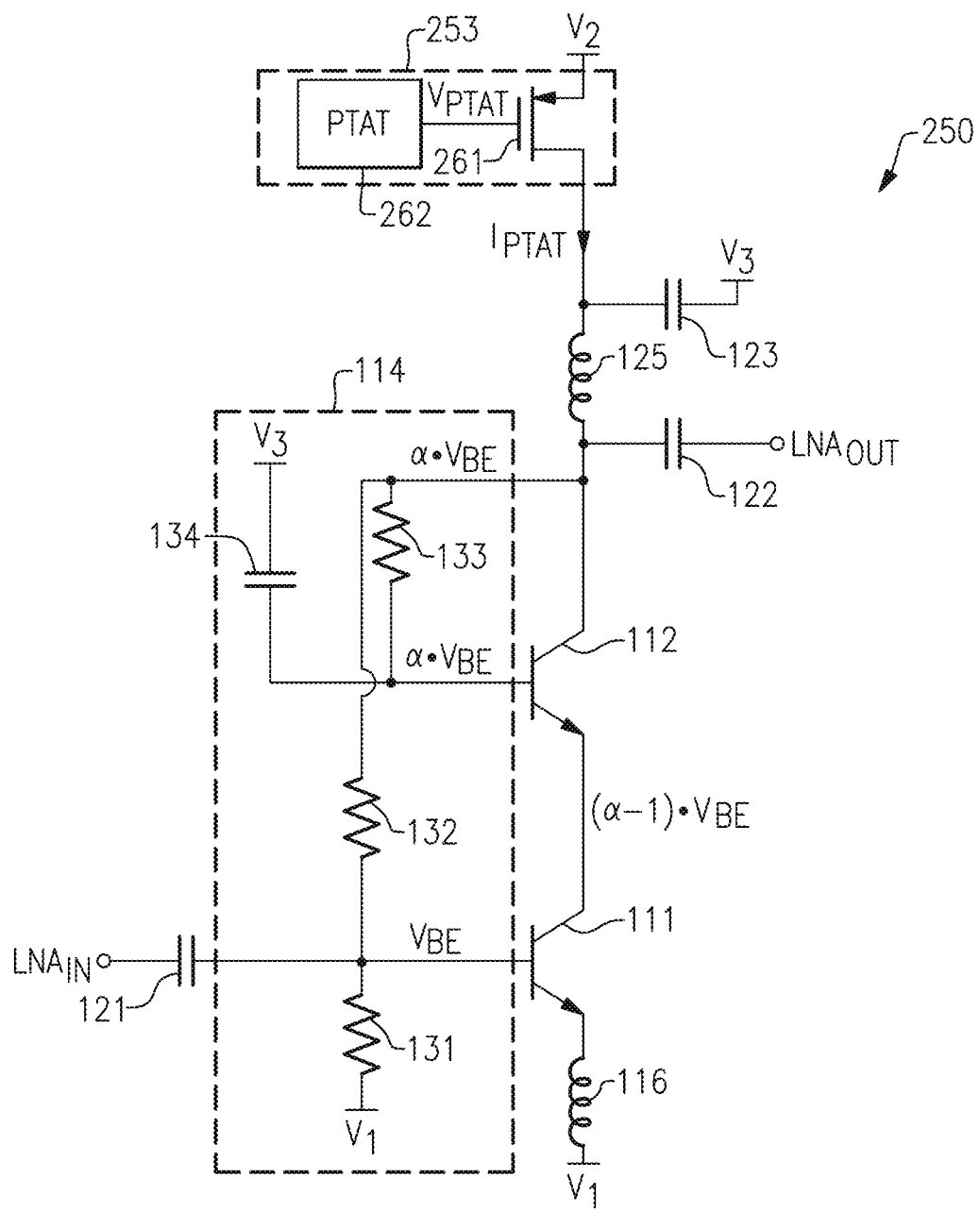
FIG. 6 is a schematic diagram of another embodiment of an LNA with self-aligned biasing.

FIG. 6 is a schematic diagram of another embodiment of an LNA 250 with self-aligned biasing. The illustrated LNA 250 includes a gm bipolar transistor 111, a cascode bipolar transistor 112, a bias current source 253, a feedback bias circuit 114, a degeneration inductor 116, an input DC blocking capacitor 121, an output matching capacitor 122, a filtering capacitor 123, and an output matching inductor 125.

The LNA 250 of FIG. 6 is similar to the LNA 110 of FIG. 5A, except that the LNA 250 includes a specific implementation of a bias current source.

As shown in FIG. 6, the bias current source 253 includes a proportional to absolute temperature (PTAT) circuit 262 and a p-type field-effect transistor (PFET) 261, which can be a PMOS transistor in certain configurations. The PFET 261 includes a gate that receives a PTAT voltage $V_{PTAT}$ from the PTAT circuit 262, a source electrically connected to the second voltage $V_2$, and a drain that generates a PTAT bias current $I_{PTAT}$ for biasing the cascode bipolar transistor 112 and the gm bipolar transistor 111.

The PTAT circuit 262 controls a gate voltage of the PFET 261 such that the current flowing through the PFET 261 is substantially PTAT. Thus, the PTAT bias current $I_{PTAT}$ is temperature dependent. In one embodiment, the PTAT circuit 262 includes a mirror PFET that operates with the PFET 261 as a current mirror. However, other implementations are possible.

Biasing a gm device and a cascode device of an LNA using a PTAT bias current enhances the performance of the LNA in the presence of temperature variation.

Examples of LNAs with Self-Aligned Biasing and a Mid-Node Impedance Network

An LNA can include a combination of a feedback bias circuit and a mid-node impedance network. Implementing an LNA in this manner can provide the benefits of enhanced biasing performance and very low current consumption in combination with superior performance with respect to S11 and/or gain/noise figure.

Although various embodiments of LNAs including both self-aligned biasing and a mid-node impedance network are illustrated, the teachings herein are applicable to a wide variety of configurations. For example, any of the LNAs of FIGS. 4-6 can include a mid-node impedance network, including, but not limited to, the mid-node impedance networks shown in FIG. 1-3.

Figure 7:
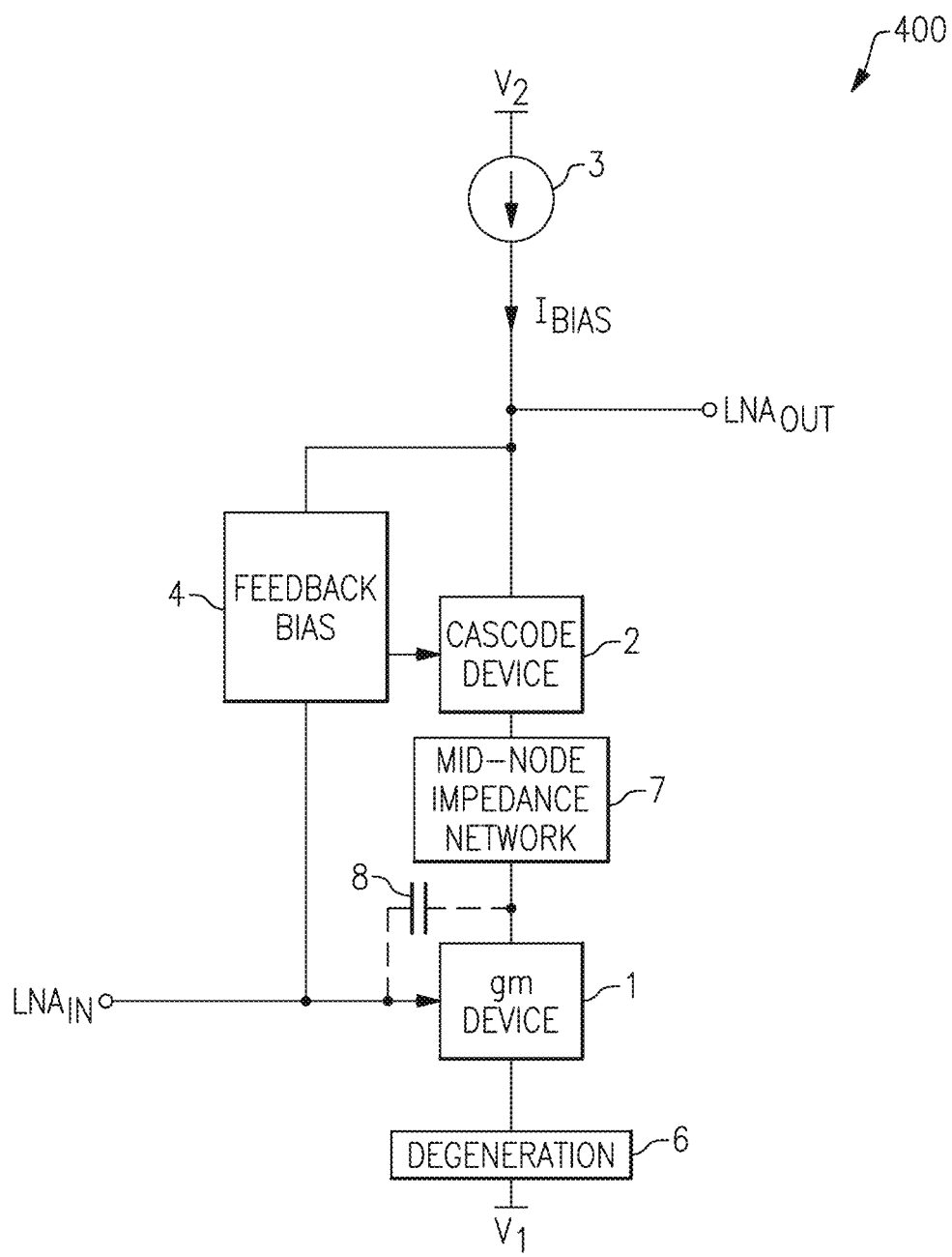
FIG. 7 is a schematic diagram of one embodiment of an LNA with self-aligned biasing and a mid-node impedance network.

FIG. 7 is a schematic diagram of one embodiment of an LNA 400 with self-aligned biasing and a mid-node impedance network.

The illustrated LNA 400 includes a gm device 1, a cascode device 2, a bias current source 3, a feedback bias circuit 4, a degeneration circuit 6, and a mid-node impedance network 7 that compensates for a parasitic capacitor 8 of the gm device 1. The LNA 400 receives an RF input signal at an input $LNA_{IN}$, and generates an amplified RF signal at an output $LNA_{OUT}$.

The LNA 400 of FIG. 7 illustrates one example of an LNA including a combination of a feedback bias circuit and a mid-node impedance network. Additional details of the LNA 400 can be similar to those described earlier.

Figure 8A:
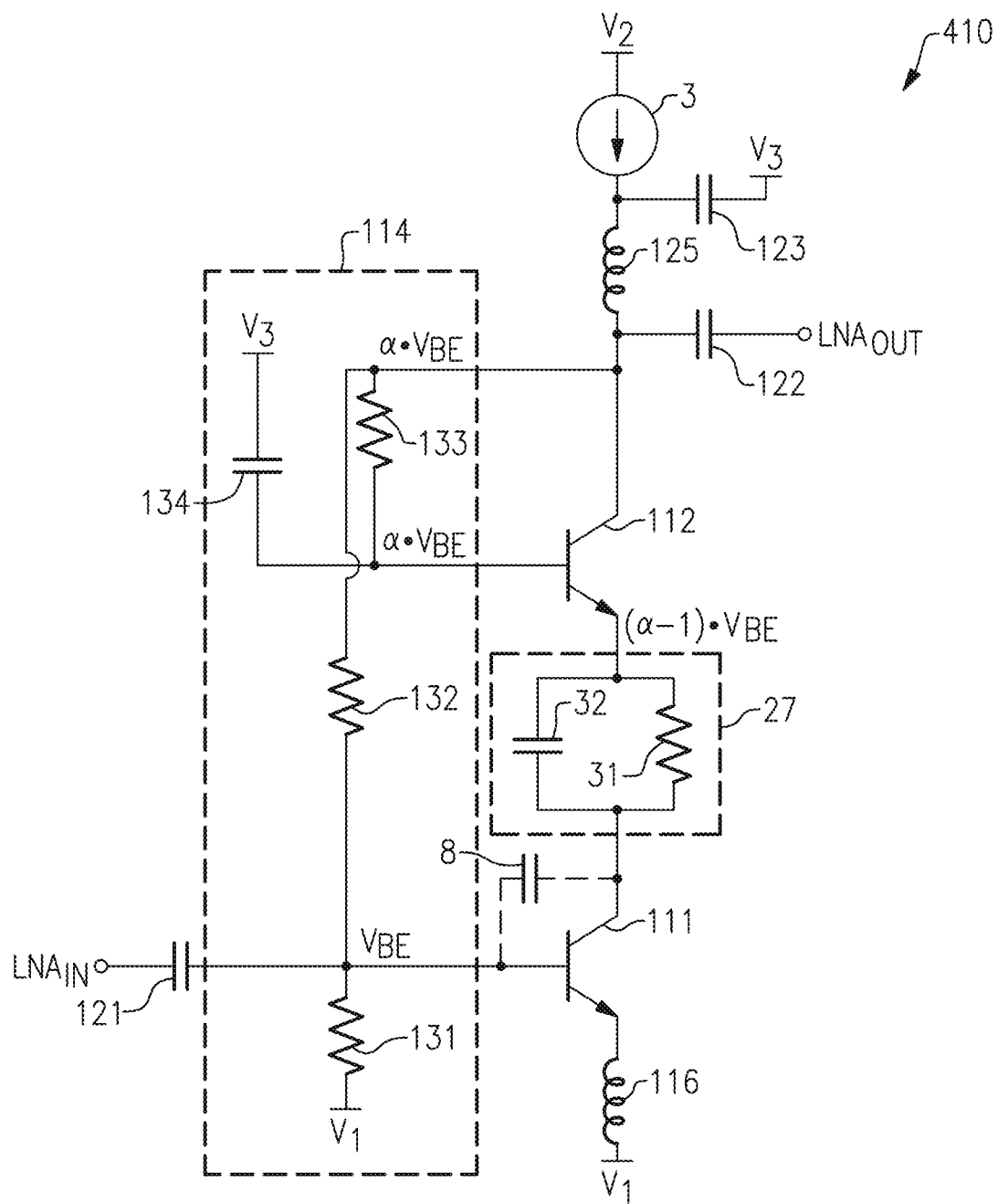
FIG. 8A is a schematic diagram of another embodiment of an LNA with self-aligned biasing and a mid-node impedance network.

FIG. 8A is a schematic diagram of another embodiment of an LNA 410 with self-aligned biasing and a mid-node impedance network.

The illustrated LNA 410 includes a gm bipolar transistor 111, a cascode bipolar transistor 112, a bias current source 3, a feedback bias circuit 114, a degeneration inductor 116, an input DC blocking capacitor 121, an output matching capacitor 122, a filtering capacitor 123, an output matching inductor 125, and a mid-node impedance network 27. The LNA 410 receives an RF input signal at an input $LNA_{IN}$, and generates an amplified RF signal at an output $LNA_{OUT}$. As shown in FIG. 8A, the feedback bias circuit 114 includes a first biasing resistor 131, a second biasing resistor 132, a third biasing resistor 133, and an RF shunt capacitor 134.

The LNA 410 of FIG. 8A illustrates another example of an LNA including a combination of a feedback bias circuit and a mid-node impedance network. Additional details of the LNA 410 can be similar to those described earlier.

Figure 8B:
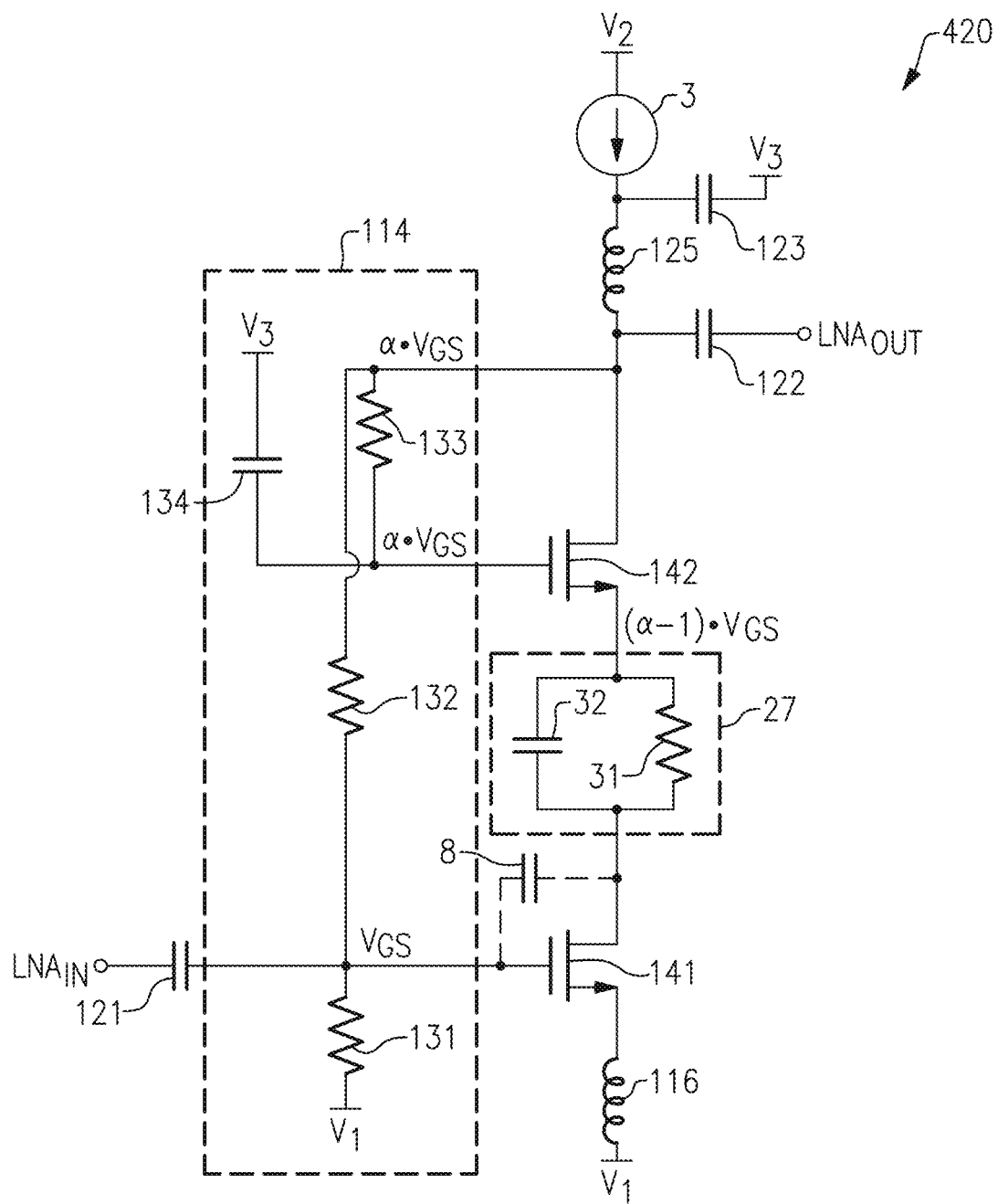
FIG. 8B is a schematic diagram of another embodiment of an LNA with self-aligned biasing and a mid-node impedance network.

FIG. 8B is a schematic diagram of another embodiment of an LNA 420 with self-aligned biasing and a mid-node impedance network.

The illustrated LNA 410 includes a gm FET 141, a cascode FET 142, a bias current source 3, a feedback bias circuit 114, a degeneration inductor 116, an input DC blocking capacitor 121, an output matching capacitor 122, a filtering capacitor 123, an output matching inductor 125, and a mid-node impedance network 27. The LNA 420 receives an RF input signal at an input $LNA_{IN}$, and generates an amplified RF signal at an output $LNA_{OUT}$. As shown in FIG. 8B, the feedback bias circuit 114 includes a first biasing resistor 131, a second biasing resistor 132, a third biasing resistor 133, and an RF shunt capacitor 134.

The LNA 420 of FIG. 8B illustrates another example of an LNA including a combination of a feedback bias circuit and a mid-node impedance network. Additional details of the LNA 420 can be similar to those described earlier.

Figure 8C:
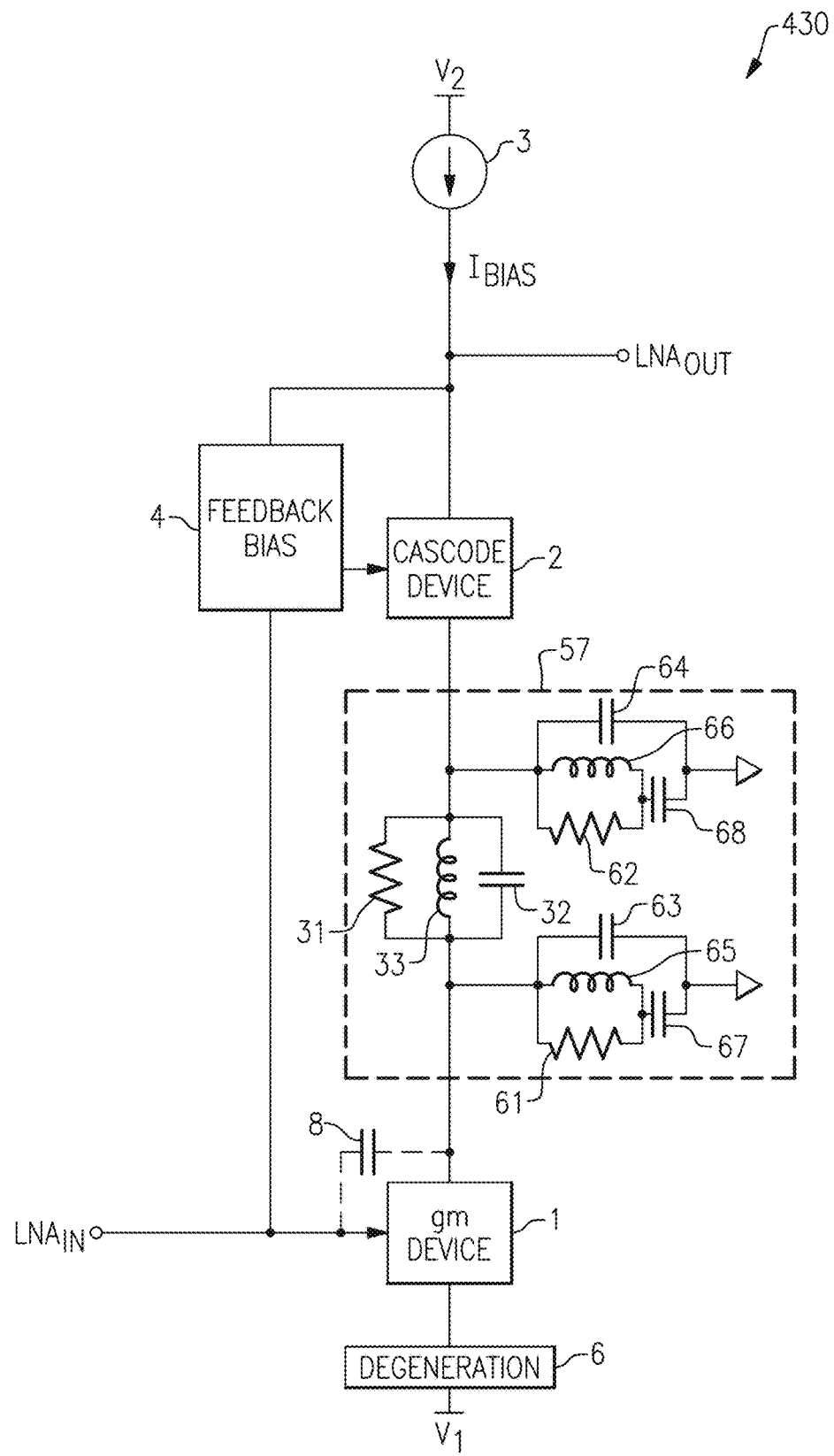
FIG. 8C is a schematic diagram of another embodiment of an LNA with self-aligned biasing and a mid-node impedance network.

FIG. 8C is a schematic diagram of another embodiment of an LNA 430 with self-aligned biasing and a mid-node impedance network.

The illustrated LNA 430 includes a gm device 1, a cascode device 2, a bias current source 3, a feedback bias circuit 4, a degeneration circuit 6, and a mid-node impedance network 57 that compensates for a parasitic capacitor 8 of the gm device 1. The LNA 430 receives an RF input signal at an input $LNA_{IN}$, and generates an amplified RF signal at an output $LNA_{OUT}$.

The mid-node impedance network 57 includes a series resistor 31, a series capacitor 32, a series inductor 33, a first shunt resistor 61, a first DC blocking capacitor 67, a first shunt capacitor 63, a first shunt inductor 65, a second shunt resistor 62, a second DC blocking capacitor 68, a second shunt capacitor 64, and a second shunt inductor 66.

The LNA 430 of FIG. 8C illustrates another example of an LNA including a combination of a feedback bias circuit and a mid-node impedance network. Additional details of the LNA 430 can be similar to those described earlier.

Examples of RF Communication Systems that Include One or More LNAs

Low noise amplifiers (LNAs) can be included in a wide variety of radio frequency (RF) communication systems.

For example, an RF front-end system can include an LNA along a signal path between an antenna and a baseband system. Some RF front-end systems can further include power amplifiers, switches, filters, mixers, and/or other electronic circuitry.

Figure 9A:
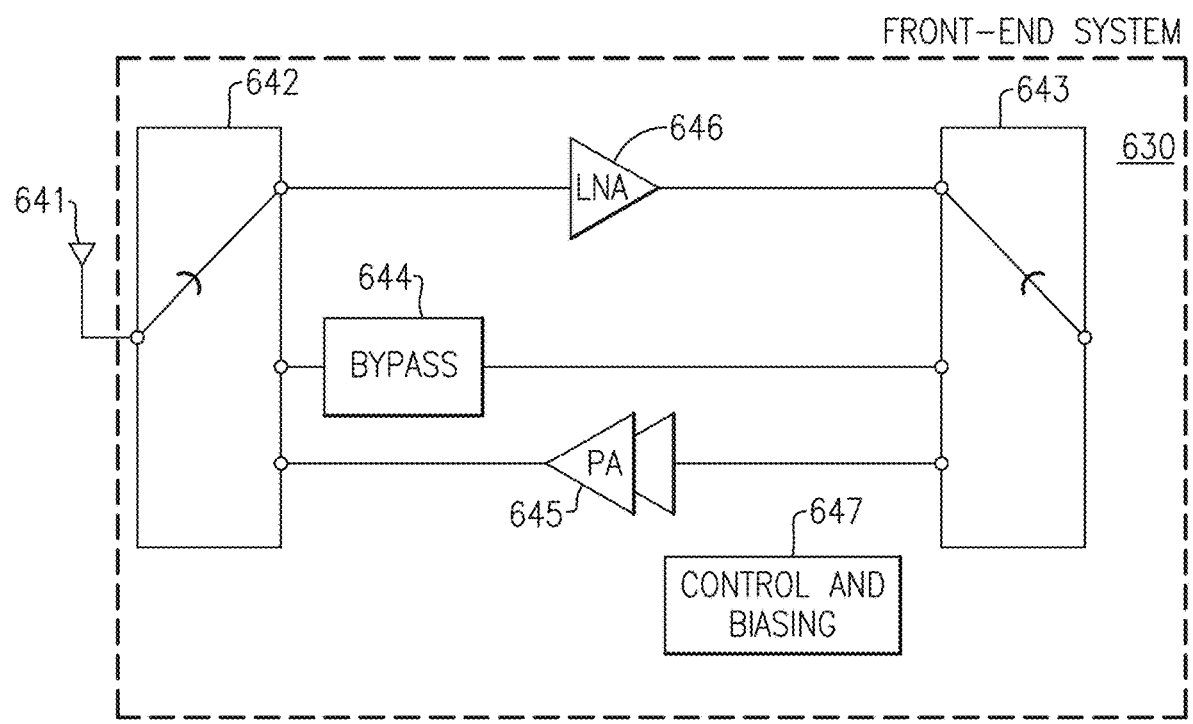
FIG. 9A is a schematic diagram of a front-end system according to one embodiment.

FIG. 9A is a schematic diagram of a front-end system 630 according to one embodiment.

The RF front-end system 630 is configured to receive RF signals from an antenna 641 and to transmit RF signals by way of the antenna 641. The illustrated front-end system 630 includes a first multi-throw switch 642, a second multi-throw switch 643, a receive signal path that includes an LNA 646, a bypass signal path that includes a bypass network 644, and a transmit signal path that includes a power amplifier 645. The LNA 646 can be implemented in accordance with any of the principles and advantages discussed herein. The bypass network 644 can include any suitable network for matching and/or bypassing the receive signal path and the transmit signal path. The bypass network 644 can be implemented by a passive impedance network or by a conductive trace or wire. The power amplifier 645 can be implemented in a wide variety of ways.

The first multi-throw switch 642 can selectively connect a particular signal path to the antenna 641. The first multi-throw switch 642 can electrically connect the receive signal path to the antenna 641 in a first state, electrically connect the bypass signal path to the antenna 641 in a second state, and electrically connect the transmit signal path to the antenna 641 in a third state.

The second multi-throw switch 643 can selectively connect a particular signal path to an input/output port of the front-end system 630, in which the particular signal path is the same signal path electrically connected to the antenna 641 by way of the first multi-throw switch 642. Accordingly, the second multi-throw switch 643 together with the first multi-throw switch 642 can selectively connect a particular signal path between the antenna 641 and the input/output port of the front-end system 630.

The control and biasing circuit 647 can be used to control and bias circuitry of the RF front-end system 630, including, but not limited to, the LNA 646.

Figure 9B:
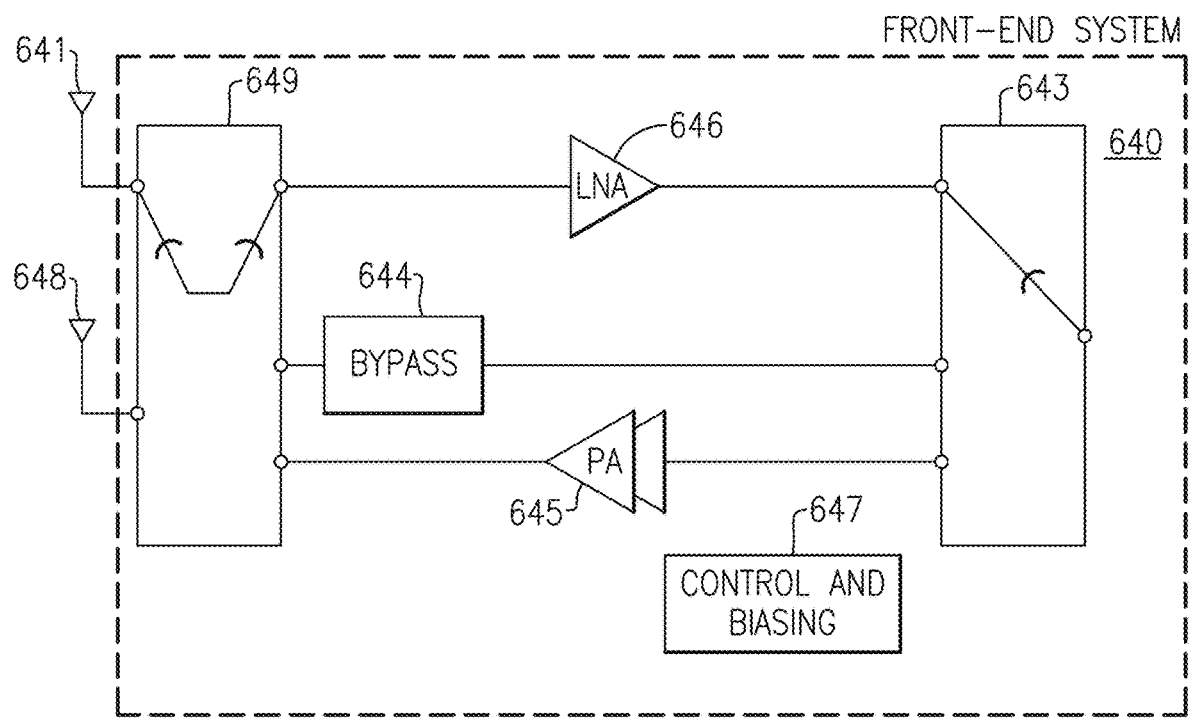
FIG. 9B is a schematic diagram of a front-end system according to another embodiment.

FIG. 9B is a schematic diagram of a front-end system 640 according to another embodiment.

The RF front-end system 640 of FIG. 9B is similar to the RF front-end system 630 of FIG. 9A, except that the first multi-throw switch 649 is configured to selectively connect a particular signal path to either a first antenna 641 or a second antenna 648. The multi-throw switch 649 can be a multi-throw, multi-pole switch.

The front-end systems of FIGS. 9A and 9B can be implemented in a packaged module. Such packaged modules can include relatively low cost laminate based front-end modules that combine low noise amplifiers with power amplifiers and/or switch functions. Some such packaged modules can be multi-chip modules (MCMs).

In certain implementations, some or the all of the illustrated components in any of the front-end systems in FIGS. 9A and/or 9B can be embodied on a single integrated circuit or die. Such a die can be manufactured using any suitable process technology. According to some implementations, one or more antennas can be integrated with any of the front-end systems discussed herein.

Figure 10A:
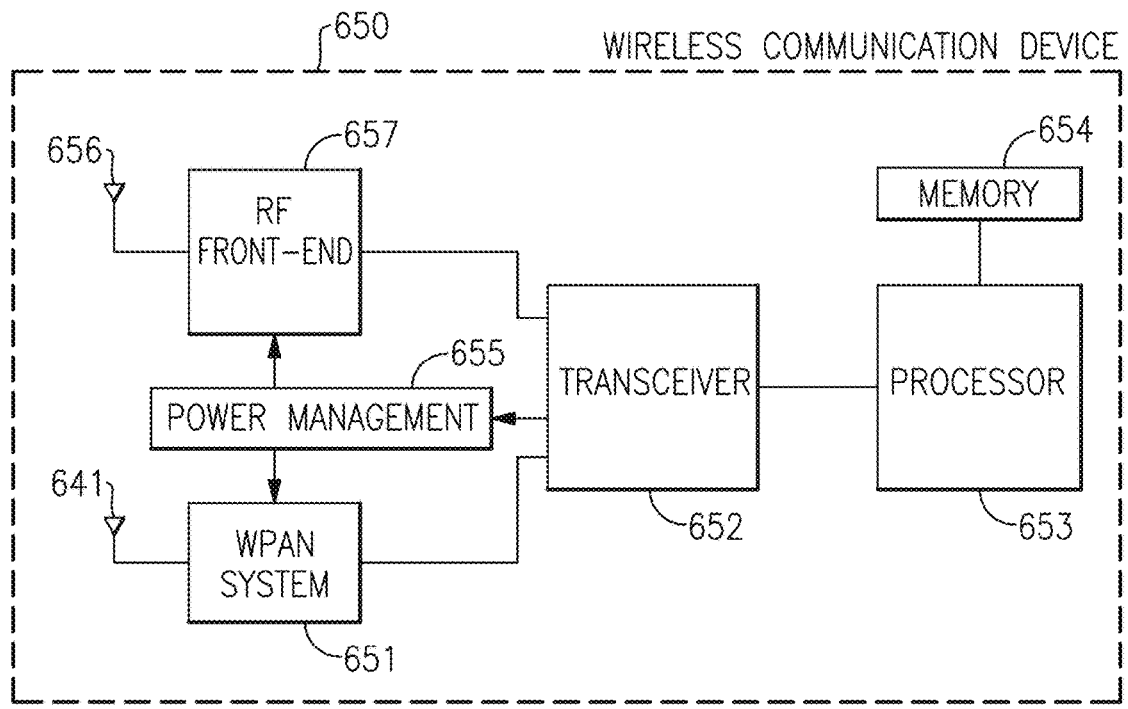
FIG. 10A is a schematic diagram of a wireless communication device according to one embodiment.
Figure 10B:
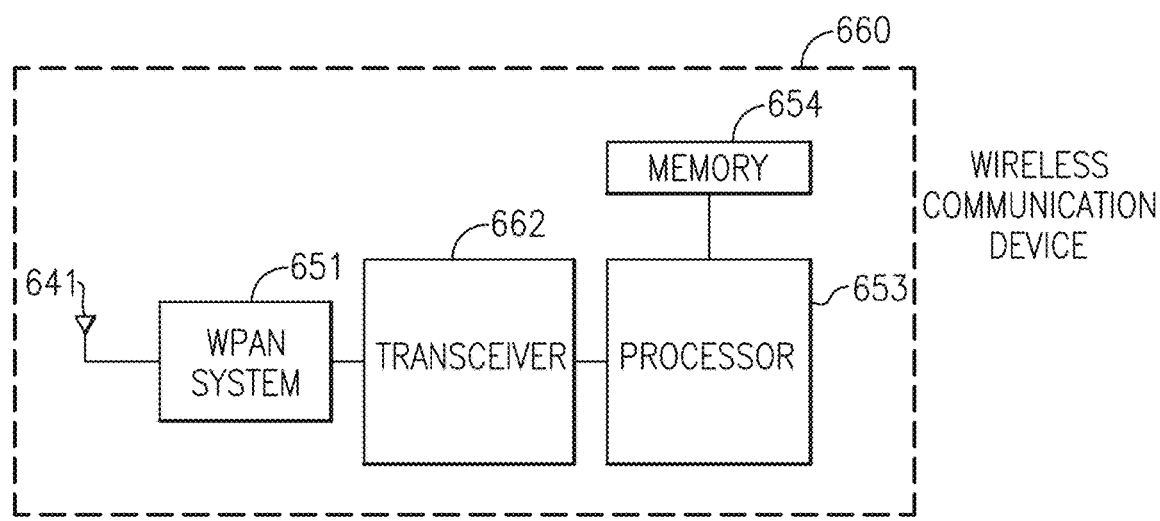
FIG. 10B is a schematic diagram of a wireless communication device according to another embodiment.

FIGS. 10A and 10B are schematic diagrams of illustrative wireless communication devices that include an LNA and/or a front-end system in accordance with one or more embodiments. The wireless communication devices can be any suitable wireless communication device. For instance, this device can be a mobile phone, such as a smart phone.

FIG. 10A is a schematic diagram of a wireless communication device 650 according to one embodiment.

As illustrated, the wireless communication device 650 includes a first antenna 641, a wireless personal area network (WPAN) system 651, a transceiver 652, a processor 653, a memory 654, a power management block 655, a second antenna 656, and an RF front-end system 657. Any of the LNAs discussed herein can be implemented in the WPAN system 651 and/or the RF front-end system 657. The WPAN system 651 is an RF front-end system configured for processing RF signals associated with personal area networks (PANs). The WPAN system 651 can be configured to transmit and receive signals associated with one or more WPAN communication standards, such as signals associated with one or more of Bluetooth, ZigBee, Z-Wave, Wireless USB, INSTEON, IrDA, or Body Area Network. In another embodiment, a wireless communication device can include a wireless local area network (WLAN) system in place of the illustrated WPAN system, and the WLAN system can process Wi-Fi signals.

FIG. 10B is a schematic diagram of a wireless communication device 660 according to another embodiment.

The illustrated wireless communication device 660 of FIG. 10B is a device configured to communicate over a PAN. This wireless communication device can be relatively less complex than the wireless communication device 650 of FIG. 10A. As illustrated, the wireless communication device 660 includes an antenna 641, a WPAN system 651, a transceiver 662, a processor 653, and a memory 654. The WPAN system 660 can include an LNA in accordance with any of the principles and advantages discussed herein.

Figure 11:
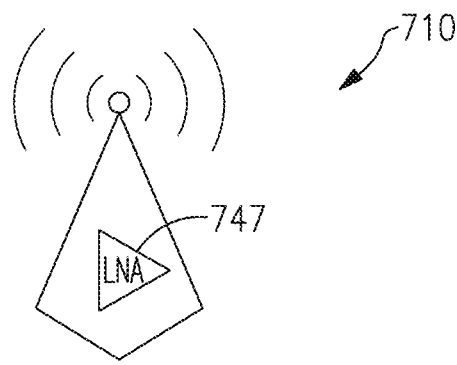
FIG. 11 is a schematic diagram of one embodiment of a base station.

FIG. 11 is a schematic diagram of one embodiment of a base station 710. The base station 710 includes an LNA 747. Although not illustrated in FIG. 11 for clarity, the base station 700 includes additional components and structures.

The LNA 747 can be implemented using one or more features disclosed herein. Although FIG. 11 illustrates one example of an RF communication system that can include an LNA implemented in accordance with the teachings herein, LNAs can be used in other configurations of electronics.

Figure 12:
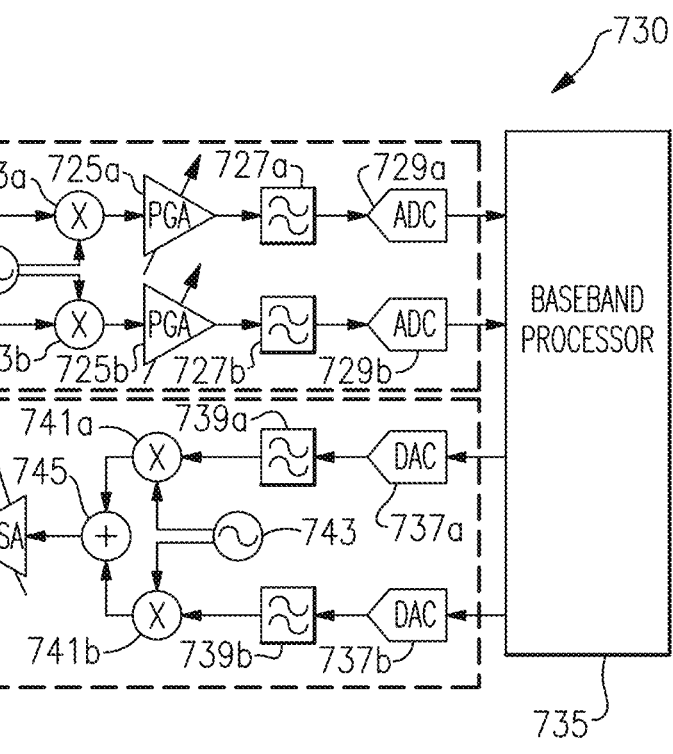
FIG. 12 is a schematic diagram of one embodiment of an RF communication system.

FIG. 12 is a schematic diagram of one embodiment of an RF communication system 730. The RF communication system 730 includes a baseband processor 735, a receive path 742, a transmit path 746, a T/R switch 731, and an antenna 759. The RF communication system 700 illustrates one example implementation of radio frequency circuitry suitable for operation in a wireless communication device or base station. However, other implementations are possible.

The RF communication system 730 can be used for transmitting and/or receiving RF signals using a variety of communication standards, including, for example, Global System for Mobile Communications (GSM), Code Division Multiple Access (CDMA), wideband CDMA (W-CDMA), Long Term Evolution (LTE), Advanced LTE, 3G (including 3GPP), 4G, Enhanced Data Rates for GSM Evolution (EDGE), wireless local loop (WLL), and/or Worldwide Interoperability for Microwave Access (WiMax), as well as other proprietary and non-proprietary communications standards.

The transmit path 746 and the receive path 742 can be used for transmitting and receiving signals over the antenna 759. Although one implementation of the RF communication system 730 is illustrated in FIG. 12, the RF communication system 730 can be modified in any suitable manner. For example, the base station 730 can be modified to include additional transmit paths, receive paths, and/or antennas.

In the illustrated configuration, the receive path 742 includes a low noise amplifier (LNA) 747, a digital step attenuator (DSA) 732, a local oscillator 722, a first mixer 723a, a second mixer 723b, a first programmable gain amplifier (PGA) 725a, a second PGA 725b, a first filter 727a, a second filter 727b, a first analog-to-digital converter (ADC) 729a, and a second ADC 729b. Although one implementation of a receive path is illustrated in FIG. 12, a receive path can include more or fewer components and/or a different arrangement of components.

An RF signal can be received on the antenna 759 and provided to the receive path 742 using the T/R switch 731. For example, the T/R switch 731 can be controlled to electrically couple the antenna 759 to an input of the LNA 747, thereby providing the received RF signal to the LNA's input. The LNA 747 provides low noise amplification such that the LNA 747 amplifies the received RF signal while adding or introducing a relatively small amount of noise. As shown in FIG. 12, the amplified RF signal generated by the LNA 747 is provided to the DSA 732. In the illustrated embodiment, an amount of attenuation provided by the DSA 732 is digitally-controllable, and can be set to achieve a desired signal power level.

The first and second mixers 723a, 723b receive first and second local oscillator clock signals, respectively, from the local oscillator 722. The first and second local oscillator clock signals can have about the same frequency and a phase difference equal to about a quarter of a period, or about 90°. The first and second mixers 723a, 723b downconvert the output of the DSA 732 using the first and second local oscillator clock signals, respectively, thereby generating first and second demodulated signals. The first and second demodulated signals can have a relative phase difference of about a quarter of a period, or about 90°, and can correspond to an in-phase (I) receive signal and a quadrature-phase (Q) signal, respectively. In certain implementations, one of the first or second oscillator clock signals is generated by phase shifting from the other.

The first and second local oscillator clock signals can have a frequency selected to achieve a desired intermediate frequency and/or baseband frequency for the first and second demodulated signals. For example, multiplying the output of the DSA 732 by a sinusoidal signal from the local oscillator 722 can produce a mixed signal having a frequency content centered about the sum and difference frequencies of the carrier frequency of the DSA output signal and the oscillation frequency of the local oscillator 722.

In the illustrated configuration, the first and second demodulated signals are amplified using the first and second programmable gain amplifiers 725a, 725b, respectively. To aid in reducing output noise, the outputs of the first and second programmable gain amplifiers 725a, 725b can be filtered using the first and second filters 727a, 727b, which can be any suitable filter, including, for example, low pass, band pass, or high pass filters. The outputs of the first and second filters 727a, 727b can be provided to the first and second ADCs 729a, 729b, respectively. The first and second ADCs 729a, 729b can have any suitable resolution. In the illustrated configuration, the outputs of the first and second ADCs 729a, 729b are provided to the baseband processor 735 for processing.

The baseband processor 735 can be implemented in a variety of ways. For instance, the baseband processor 735 can include a digital signal processor, a microprocessor, a programmable core, the like, or any combination thereof. Moreover, in some implementations, two or more baseband processors can be included in the RF communication system 730.

As shown in FIG. 12, the transmit path 746 receives data from the baseband processor 735 and is used to transmit RF signals via the antenna 759. The transmit path 746 and the receive path 742 both operate using the antenna 759, and access to the antenna 759 is controlled using the T/R switch 731. The illustrated transmit path 746 includes first and second digital-to-analog converters (DACs) 737a, 737b, first and second filters 739a, 739b, first and second mixers 741a, 741b, a local oscillator 743, a combiner 745, a DSA 732, an output filter 751, and a power amplifier 758. Although one implementation of a transmit path is illustrated in FIG. 12, a transmit path can include more or fewer components and/or a different arrangement of components.

The baseband processor 735 can output a digital in-phase (I) signal and a digital quadrature-phase (Q) signal, which can be separately processed until they are combined using the combiner 745. The first DAC 737a converts the digital I signal into an analog I signal, and the second DAC 737b converts the digital Q signal into an analog Q signal. The first and second DACs 737a, 737b can have any suitable precision. The analog I signal and the analog Q signal can be filtered using the first and second filters 739a, 739b, respectively. The outputs of the first and second filters 739a, 739b can be upconverted using the first and second mixers 741a, 741b, respectively. For example, the first mixer 741a is used to upconvert the output of the first filter 739a based on an oscillation frequency of the local oscillator 743, and the second mixer 741b is used to upconvert the output of the second filter 739b based on the oscillation frequency of the local oscillator 743.

The combiner 743 combines the outputs of the first and second mixers 741a, 741b to generate a combined RF signal. The combined RF signal is provided to an input of the DSA 732, which is used to control a signal power level of the combined RF signal.

The output of the DSA 732 can be filtered using the output filter 751, which can be, for example, a low pass, band pass, or high pass filter configured to remove noise and/or unwanted frequency components from the signal. The output of the output filter 751 can be amplified by a power amplifier 758. In some implementations, the power amplifier 758 includes a plurality of stages cascaded to achieve a target gain. The power amplifier 758 can provide an amplified RF signal to the antenna 759 through the T/R switch 731.

The LNA 747 of FIG. 12 is implemented using one or more features disclosed herein. Although FIG. 12 illustrates one example of an RF communication system that can include an LNA implemented in accordance with the teachings herein, LNAs can be used in other configurations of electronics.

Figure 13:
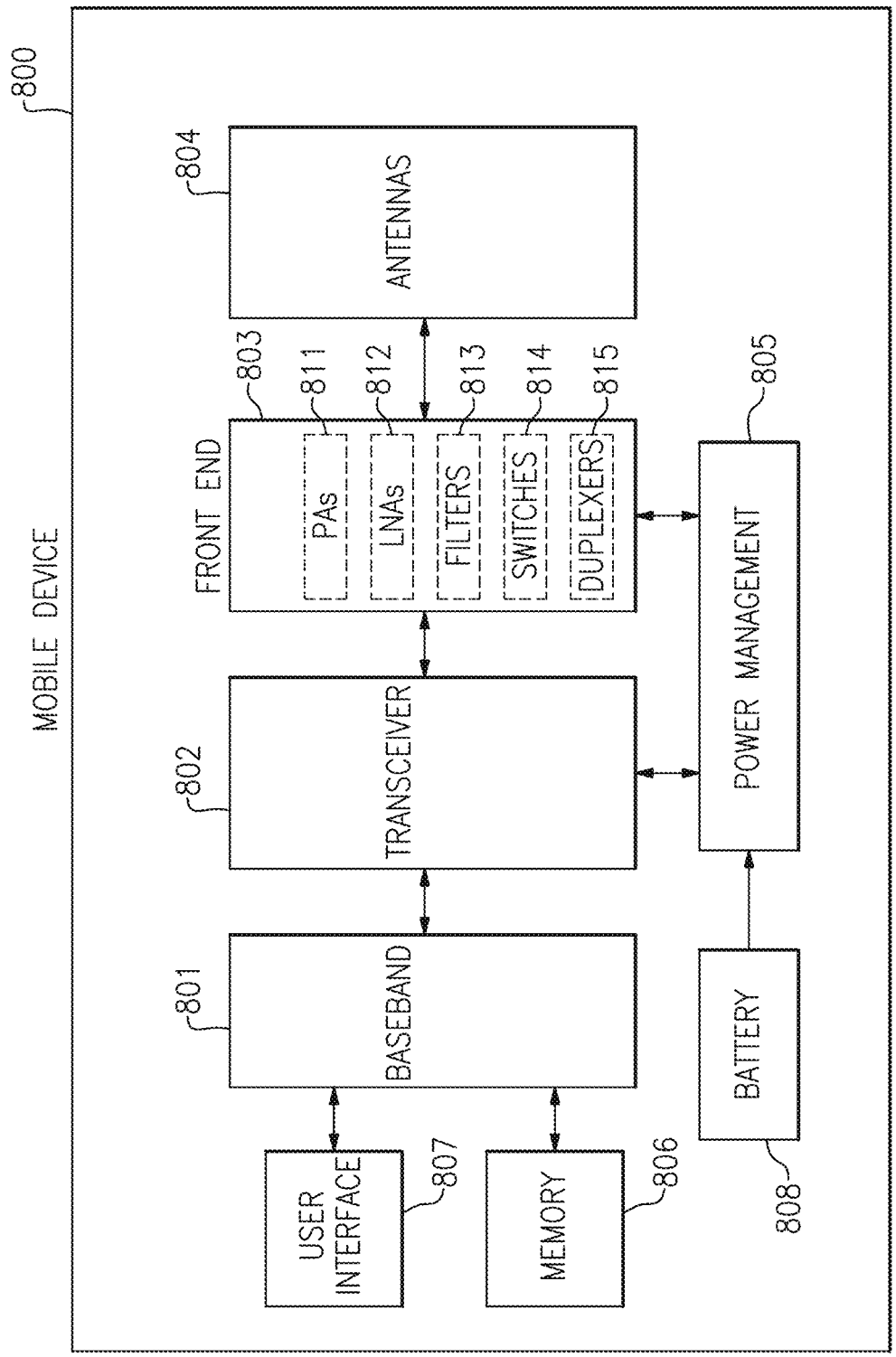
FIG. 13 is a schematic diagram of one embodiment of a mobile device.

FIG. 13 is a schematic diagram of one embodiment of a mobile device 800. The mobile device 800 includes a baseband system 801, a transceiver 802, a front end system 803, antennas 804, a power management system 805, a memory 806, a user interface 807, and a battery 808.

The mobile device 800 can be used communicate using a wide variety of communications technologies, including, but not limited to, 2G, 3G, 4G (including LTE, LTE-Advanced, and LTE-Advanced Pro), 5G NR, WLAN (for instance, Wi-Fi), WPAN (for instance, Bluetooth and ZigBee), WMAN (for instance, WiMax), and/or GPS technologies.

The transceiver 802 generates RF signals for transmission and processes incoming RF signals received from the antennas 804. It will be understood that various functionalities associated with the transmission and receiving of RF signals can be achieved by one or more components that are collectively represented in FIG. 13 as the transceiver 802. In one example, separate components (for instance, separate circuits or dies) can be provided for handling certain types of RF signals.

The front end system 803 aids is conditioning signals transmitted to and/or received from the antennas 804. In the illustrated embodiment, the front end system 803 includes one or more power amplifiers (PAs) 811, one or more low noise amplifiers (LNAs) 812, one or more filters 813, one or more switches 814, and one or more duplexers 815. However, other implementations are possible.

For example, the front end system 803 can provide a number of functionalities, including, but not limited to, amplifying signals for transmission, amplifying received signals, filtering signals, switching between different bands, switching between different power modes, switching between transmission and receiving modes, duplexing of signals, multiplexing of signals (for instance, diplexing or triplexing), or some combination thereof.

At least one of the LNAs 812 can be implemented using one or more features disclosed herein. Although FIG. 13 illustrates one example of an RF communication system that can include LNAs implemented in accordance with the teachings herein, LNAs can be used in other configurations of electronics.

In certain implementations, the mobile device 800 supports carrier aggregation, thereby providing flexibility to increase peak data rates. Carrier aggregation can be used for both Frequency Division Duplexing (FDD) and Time Division Duplexing (TDD), and may be used to aggregate a plurality of carriers or channels. Carrier aggregation includes contiguous aggregation, in which contiguous carriers within the same operating frequency band are aggregated. Carrier aggregation can also be non-contiguous, and can include carriers separated in frequency within a common band or in different bands.

The antennas 804 can include antennas used for a wide variety of types of communications. For example, the antennas 804 can include antennas for transmitting and/or receiving signals associated with a wide variety of frequencies and communications standards.

In certain implementations, the antennas 804 support MIMO communications and/or switched diversity communications. For example, MIMO communications use multiple antennas for communicating multiple data streams over a single radio frequency channel. MIMO communications benefit from higher signal to noise ratio, improved coding, and/or reduced signal interference due to spatial multiplexing differences of the radio environment. Switched diversity refers to communications in which a particular antenna is selected for operation at a particular time. For example, a switch can be used to select a particular antenna from a group of antennas based on a variety of factors, such as an observed bit error rate and/or a signal strength indicator.

The mobile device 800 can operate with beamforming in certain implementations. For example, the front end system 803 can include phase shifters having variable phase controlled by the transceiver 802. Additionally, the phase shifters are controlled to provide beam formation and directivity for transmission and/or reception of signals using the antennas 804. For example, in the context of signal transmission, the phases of the transmit signals provided to the antennas 804 are controlled such that radiated signals from the antennas 804 combine using constructive and destructive interference to generate an aggregate transmit signal exhibiting beam-like qualities with more signal strength propagating in a given direction. In the context of signal reception, the phases are controlled such that more signal energy is received when the signal is arriving to the antennas 804 from a particular direction. In certain implementations, the antennas 804 include one or more arrays of antenna elements to enhance beamforming.

The baseband system 801 is coupled to the user interface 807 to facilitate processing of various user input and output (I/O), such as voice and data. The baseband system 801 provides the transceiver 802 with digital representations of transmit signals, which the transceiver 802 processes to generate RF signals for transmission. The baseband system 801 also processes digital representations of received signals provided by the transceiver 802. As shown in FIG. 13, the baseband system 801 is coupled to the memory 806 of facilitate operation of the mobile device 800.

The memory 806 can be used for a wide variety of purposes, such as storing data and/or instructions to facilitate the operation of the mobile device 800 and/or to provide storage of user information.

The power management system 805 provides a number of power management functions of the mobile device 800. In certain implementations, the power management system 805 includes a PA supply control circuit that controls the supply voltages of the power amplifiers 811. For example, the power management system 805 can be configured to change the supply voltage(s) provided to one or more of the power amplifiers 811 to improve efficiency, such as power added efficiency (PAE).

As shown in FIG. 13, the power management system 805 receives a battery voltage from the battery 808. The battery 808 can be any suitable battery for use in the mobile device 800, including, for example, a lithium-ion battery.

Figure 14A:
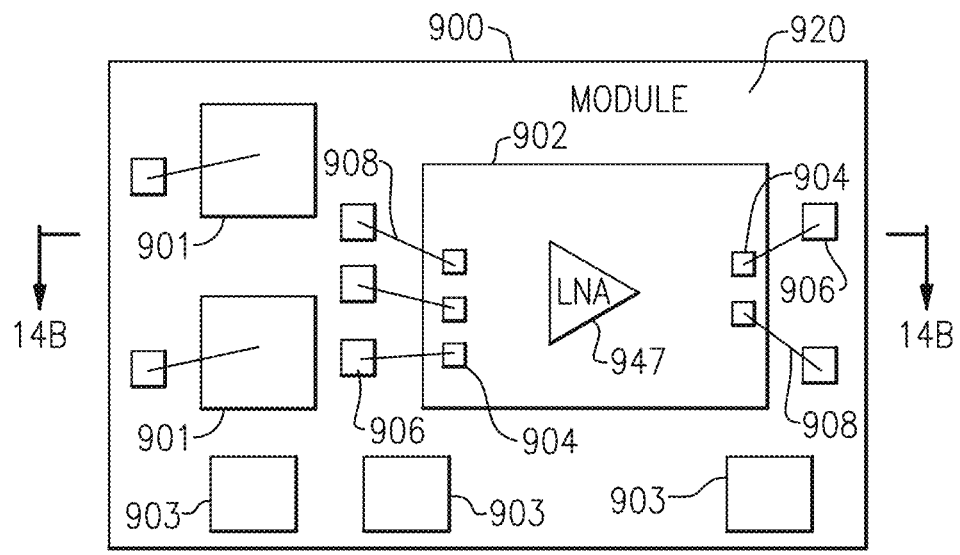
FIG. 14A is a schematic diagram of one embodiment of a packaged module.
Figure 14B:
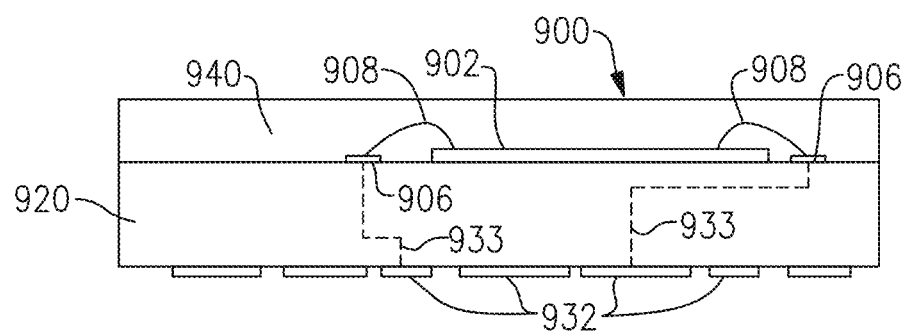
FIG. 14B is a schematic diagram of a cross-section of the packaged module of FIG. 14A taken along the lines 14B-14B.

FIG. 14A is a schematic diagram of one embodiment of a packaged module 900. FIG. 14B is a schematic diagram of a cross-section of the packaged module 900 of FIG. 14A taken along the lines 14B-14B.

The packaged module 900 includes radio frequency components 901, a semiconductor die 902, surface mount devices 903, wirebonds 908, a package substrate 920, and encapsulation structure 940. The package substrate 920 includes pads 906 formed from conductors disposed therein. Additionally, the semiconductor die 902 includes pins or pads 904, and the wirebonds 908 have been used to connect the pads 904 of the die 902 to the pads 906 of the package substrate 920.

The semiconductor die 902 includes an LNA 947, which is implemented using one or more features disclosed herein. Although the packaged module 900 illustrates one example of a module that can include an LNA implemented in accordance with the teachings herein, LNAs can be used in other configurations of electronics.

The packaging substrate 920 can be configured to receive a plurality of components such as the semiconductor die 902 and the surface mount devices 903, which can include, for example, surface mount capacitors and/or inductors. In one implementation, the radio frequency components 901 include integrated passive devices (IPDs).

As shown in FIG. 14B, the packaged module 900 is shown to include a plurality of contact pads 932 disposed on the side of the packaged module 900 opposite the side used to mount the semiconductor die 902. Configuring the packaged module 900 in this manner can aid in connecting the packaged module 900 to a circuit board, such as a phone board of a wireless device. The example contact pads 932 can be configured to provide radio frequency signals, bias signals, and/or power (for example, a power supply voltage and ground) to the semiconductor die 902 and/or the surface mount devices 903. As shown in FIG. 14B, the electrical connections between the contact pads 932 and the semiconductor die 902 can be facilitated by connections 933 through the package substrate 920. The connections 933 can represent electrical paths formed through the package substrate 920, such as connections associated with vias and conductors of a multilayer laminated package substrate.

In some embodiments, the packaged module 900 can also include one or more packaging structures to, for example, provide protection and/or facilitate handling. Such a packaging structure can include overmold or encapsulation structure 940 formed over the packaging substrate 920 and the components and die(s) disposed thereon.

It will be understood that although the packaged module 900 is described in the context of electrical connections based on wirebonds, one or more features of the present disclosure can also be implemented in other packaging configurations, including, for example, flip-chip configurations.

Applications

Some of the embodiments described above have provided examples in connection with LNAs that are included in front-end modules and/or wireless communications devices. However, the principles and advantages of the embodiments can be used for any other systems or apparatus that benefit from any of the circuits described herein.

For example, low noise amplifiers can be included in various electronic devices, including, but not limited to consumer electronic products, parts of the consumer electronic products, electronic test equipment, etc. Examples of the electronic devices can also include, but are not limited to, memory chips, memory modules, circuits of optical networks or other communication networks, and disk driver circuits. The consumer electronic products can include, but are not limited to, a mobile phone, a telephone, a television, a computer monitor, a computer, a hand-held computer, a personal digital assistant (PDA), a microwave, a refrigerator, an automobile, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

CONCLUSION

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "can," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A low noise amplifier comprising:
   a mid-node impedance circuit including a resistor and a capacitor electrically connected in parallel, the mid-node impedance circuit operable to decouple a gain and a reflection coefficient of the low noise amplifier;
   a cascode device electrically connected between an output terminal and the mid-node impedance circuit;
   a transconductance device electrically connected between the mid-node impedance circuit and ground, the transconductance device configured to amplify a radio frequency signal received from an input terminal; and
   a feedback bias circuit electrically connected between the output terminal and the input terminal and operable to control an input bias voltage of the transconductance device.

2. The low noise amplifier of claim 1 wherein the transconductance device and the cascode device are bipolar transistors, the transconductance device having a base configured to receive the radio frequency signal and the input bias voltage.

3. The low noise amplifier of claim 2 wherein the resistor and the capacitor are electrically connected in parallel between an emitter of the cascode device and a collector of the transconductance device.

4. The low noise amplifier of claim 2 wherein the feedback bias circuit is further configured to bias the cascode device, the feedback bias circuit including a feedback resistor electrically connected between the output terminal and a base of the cascode device.

5. The low noise amplifier of claim 1 wherein the transconductance device and the cascode device are field-effect transistors, the transconductance device having a gate configured to receive the radio frequency signal and the input bias voltage.

6. The low noise amplifier of claim 5 wherein the resistor and the capacitor are electrically connected in parallel between a source of the cascode device and a drain of the transconductance device.

7. The low noise amplifier of claim 5 wherein the feedback bias circuit is further configured to bias the cascode device, the feedback bias circuit including a feedback resistor electrically connected between the output terminal and a gate of the cascode device.

8. The low noise amplifier of claim 1 wherein the mid-node impedance circuit further includes a shunt capacitor in shunt with respect to a radio frequency signal path through the transconductance device and the cascode device.

9. The low noise amplifier of claim 1 further comprising a bias current source and an inductor electrically connected in series between a supply voltage and the cascode device.

10. The low noise amplifier of claim 1 further comprising a degeneration inductor electrically connected between the transconductance device and ground.

11. A low noise amplifier comprising:
    a mid-node impedance circuit including a resistor and a capacitor electrically connected in parallel;
    a cascode device electrically connected between an output terminal and the mid-node impedance circuit;
    a transconductance device electrically connected between the mid-node impedance circuit and ground, the transconductance device configured to amplify a radio frequency signal received from an input terminal;
    a feedback bias circuit electrically connected between the output terminal and the input terminal and operable to control an input bias voltage of the transconductance device; and
    a bias current source and an inductor electrically connected in series between a supply voltage and the cascode device, the bias current source including a p-type field-effect transistor and a proportional to absolute temperature circuit that controls a gate voltage of the p-type field-effect transistor such that a bias current outputted from the p-type field-effect transistor is substantially proportional to absolute temperature.

12. The low noise amplifier of claim 11 further comprising a degeneration inductor electrically connected between the transconductance device and ground.

13. The low noise amplifier of claim 11 wherein the transconductance device and the cascode device are bipolar transistors, the transconductance device having a base configured to receive the radio frequency signal and the input bias voltage.

14. The low noise amplifier of claim 13 wherein the resistor and the capacitor are electrically connected in parallel between an emitter of the cascode device and a collector of the transconductance device.

15. A packaged module comprising:

a package substrate; and a semiconductor die attached to the package substrate and including a low noise amplifier fabricated thereon, the low noise amplifier including a mid-node impedance circuit including a resistor and a capacitor electrically connected in parallel, a cascode device electrically connected between an output terminal and the mid-node impedance circuit, a transconductance device electrically connected between the mid-node impedance circuit and ground and configured to amplify a radio frequency signal received from an input terminal, and a feedback bias circuit electrically connected between the output terminal and the input terminal and operable to control an input bias voltage of the transconductance device, the mid-node impedance operable to decouple a gain and a reflection coefficient of the low noise amplifier.

16. The packaged module of claim 15 wherein the mid-node impedance circuit further includes a shunt capacitor in shunt with respect to a radio frequency signal path through the transconductance device and the cascode device.

17. The packaged module of claim 15 further comprising a bias current source and an inductor electrically connected in series between a supply voltage and the cascode device.

18. A mobile device comprising:

an antenna;

a front end system including a low noise amplifier having an input terminal configured to receive a radio frequency signal from the antenna and an output terminal configured to output an amplified radio frequency signal, the low noise amplifier including a mid-node impedance circuit including a resistor and a capacitor electrically connected in parallel, a cascode device electrically connected between the output terminal and the mid-node impedance circuit, a transconductance device electrically connected between the mid-node impedance circuit and ground and configured to amplify the radio frequency signal, and a feedback bias circuit electrically connected between the output terminal and the input terminal and operable to control an input bias voltage of the transconductance device, the mid-node impedance operable to decouple a gain and a reflection coefficient of the low noise amplifier; and a transceiver configured to receive the amplified radio frequency signal.

19. The mobile device of claim 18 wherein the mid-node impedance circuit further includes a shunt capacitor in shunt with respect to a radio frequency signal path through the transconductance device and the cascode device.

20. The mobile device of claim 18 further comprising a bias current source and an inductor electrically connected in series between a supply voltage and the cascode device.

* * * * *